(12) United States Patent
Park et al.

(10) Patent No.: US 7,542,350 B2
(45) Date of Patent: Jun. 2, 2009

(54) METHODS OF RESTORING DATA IN FLASH MEMORY DEVICES AND RELATED FLASH MEMORY DEVICE MEMORY SYSTEMS

(75) Inventors: Ki-Tae Park, Gyeonggi-do (KR); Ki-Nam Kim, Seoul (KR); Yeong-Taek Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 125 days.

(21) Appl. No.: 11/616,411

(22) Filed: Dec. 27, 2006

(65) Prior Publication Data
US 2008/0094914 A1 Apr. 24, 2008

(30) Foreign Application Priority Data
Oct. 20, 2006 (KR) .................. 10-2006-0102379

(51) Int. Cl.
*G11C 16/04* (2006.01)
(52) U.S. Cl. .................. 365/185.24; 365/189.09; 365/235; 365/189.04; 365/185.33
(58) Field of Classification Search ............ 365/185.24, 365/189.09, 235, 189.04, 185.33
See application file for complete search history.

(56) References Cited

U.S. PATENT DOCUMENTS

| | | | |
|---|---|---|---|
| 6,046,932 | A | 4/2000 | Bill et al. |
| 6,058,047 | A | 5/2000 | Kikuchi |
| 6,636,440 | B2 | 10/2003 | Manyan et al. |
| 6,717,847 | B2 * | 4/2004 | Chen ............ 365/185.03 |
| 6,813,183 | B2 | 11/2004 | Chevallier |
| 2002/0024846 | A1 * | 2/2002 | Kawahara et al. ...... 365/185.24 |
| 2004/0213031 | A1 * | 10/2004 | Hosono et al. ............ 365/145 |
| 2005/0017381 | A1 * | 1/2005 | Armstrong et al. .......... 261/97 |
| 2005/0083726 | A1 * | 4/2005 | Auclair et al. ............ 365/154 |
| 2007/0014153 | A1 * | 1/2007 | Gorobets et al. ....... 365/185.12 |
| 2007/0189071 | A1 * | 8/2007 | Vali et al. ............ 365/185.08 |

FOREIGN PATENT DOCUMENTS

| | | |
|---|---|---|
| JP | 10-055691 | 2/1998 |
| JP | 09-282895 | 10/2007 |
| KR | 100253276 B1 | 1/2000 |
| KR | 102000027920 A | 5/2000 |
| KR | 1020010001063 A | 1/2001 |
| KR | 1020010061511 A | 7/2001 |
| KR | 1020020015981 A | 3/2002 |
| KR | 1020040049114 A | 6/2004 |
| KR | 10-2004-0047835 A | 6/2005 |
| KR | 1020050087264 A | 8/2005 |

* cited by examiner

*Primary Examiner*—Thong Q Le
(74) *Attorney, Agent, or Firm*—Myers Bigel Sibley & Sajovec

(57) ABSTRACT

Methods for setting a read voltage in a memory system which comprises a flash memory device and a memory controller for controlling the flash memory device, comprise sequentially varying a distribution read voltage to read page data from the flash memory device; constituting a distribution table having a data bit number and a distribution read voltage, the data bit number indicating an erase state among the page data respectively read from the flash memory device and the distribution read voltage corresponding to the read page data; detecting distribution read voltages corresponding to data bit numbers each indicating maximum points of possible cell states of a memory cell, based on the distribution table; and defining new read voltages based on the detected distribution read voltages.

41 Claims, 18 Drawing Sheets

- - - - : Target Vth distribution before HTS+Cycling
——— : Target Vth distribution after HTS+Cycling

- - - - : Target Vth distribution before HTS+Cycling
——— : Target Vth distribution after HTS+Cycling
- - - - : Target Vth distribution after HTS+Cycling Fig. 4
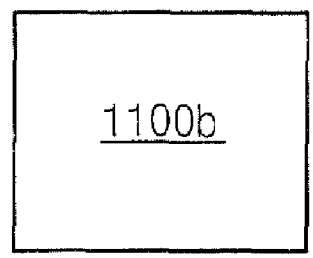 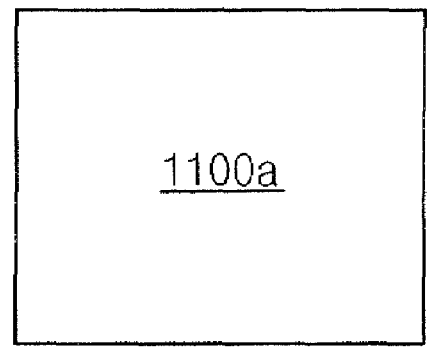
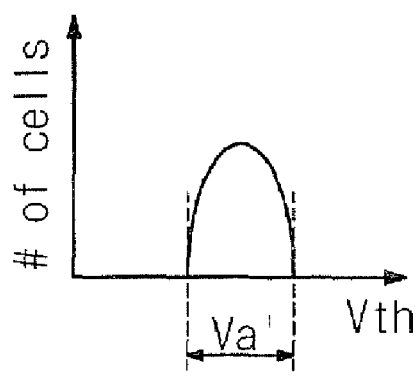 Va' ≈ Va 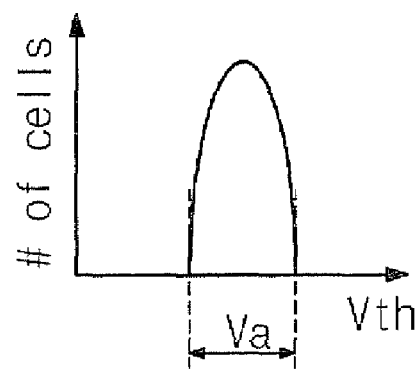

Fig. 5

|  | Column0 | Column1 | Column2 | ... | Column(m-1) |
|---|---|---|---|---|---|
| Page0 | 0 | 0 | 1 | ... | 1 LSB |
| Page1 | 1 | 1 | 0 | ... | 0 MSB |
| Page2 | 1 | 0 | 1 | ... | 0 LSB |
| ... | ... | ... | ... | ... | ... |
| Page(n-1) | 0 | 1 | 0 | ... | 1 MSB |

WL0 { Page0, Page1 }
WL1 { Page2, ... }
WL(x-1) { Page(n-1) }

| #of erased cells | Vread |
|---|---|
| 0 | Vread0 |
| 1 | Vread1 |
| 3 | Vread2 |
| ⋮ | ⋮ |
| 950 | Vread(m−1) |
| 1000 | Vread m |
| 940 | Vread(m+1) |
| ⋮ | ⋮ |
| 939 | Vread(n−1) |
| 990 | Vread n |
| 940 | Vread(n+1) |
| ⋮ | ⋮ |

Max point (ST0) → 1000 Vread m

Max point (ST1) → 990 Vread n

METHODS OF RESTORING DATA IN FLASH MEMORY DEVICES AND RELATED FLASH MEMORY DEVICE MEMORY SYSTEMS

CROSS-REFERENCE TO RELATED APPLICATION

This U.S. non-provisional patent application claims priority under 35 U.S.C § 119 from Korean Patent Application 2006-102379, filed on Oct. 20, 2006, the disclosure of which is hereby incorporated by reference herein as if set forth in its entirety.

FIELD OF THE INVENTION

The present invention relates to semiconductor memory devices and, more particularly, to electrically erasable and programmable flash memory devices.

BACKGROUND

Electrically erasable and programmable read only memory (EEPROM) devices refer to a class of semiconductor memory devices in which the data stored therein may be erased and replaced with new data. In some conventional EEPROM devices, only one memory region can be erased or programmed at any given time. Flash memory devices are a type of EEPROM device that enable multiple memory regions to be erased or programmed simultaneously through one program operation. As such, flash memory devices can operate at higher speeds than other conventional EEPROM devices. However, after a specific number of erase operations, the reliability of flash memories and other EEPROM devices may deteriorate due to degradation of an insulating layer that covers the charge storage cells that store data in the devices.

Flash memory devices continue to store information after the power supply to the device is cut off. In addition, flash memory devices are relatively robust and resistant to damage when subjected to, for example, physical impact. Flash memory devices also exhibit relatively fast read access times. Because of these characteristics, flash memory devices are now widely employed for both code and data storage in, for example, battery powered electronic devices such as personal digital assistants, cellular telephones, digital cameras, portable gaming consoles, MP3 players and the like. Flash memory devices may also be used in home applications such as high-definition TVs, digital versatile disks (DVDs), routers, and global positioning systems (GPSs). Flash memory devices are generally classified into two groups, namely NOR flash memory devices and NAND flash memory devices based on the configuration of the logic gates included in the device.

Flash memory devices store information in arrays of transistors or "cells." Typically, each cell in the device stores one bit of information. "Multi-level" flash memory devices are also known that can store more than one bit of information per cell by varying the charge amount stored in the floating gate of each cell.

Two important reliability characteristics of flash memory devices that have a floating gate structure are (1) the number of program (write)/erase cycles that the device can withstand without degradation (which is often referred to as the "endurance" of the device) and (2) the data-retention characteristics of the device. The endurance of the flash memory device is an important consideration because the repeated program/erase cycles (referred to herein as "cycling") can subject oxide layers in the device to stresses that can cause failure such as, for example, breakdown of tunnel oxide layers in the device. The threshold voltage of a memory cell may be lowered due to such stresses, which may allow electrons to leak away from the floating gate of a programmed memory cell.

FIG. 1 is a graphical diagram illustrating the threshold voltage distributions for each state of a conventional flash memory device that stores multi-level data. In the example of FIG. 1, each memory cell of the flash memory device may be in one of four different states. As shown in FIG. 1, voltages Read1, Read2 and Read3 define the four states. In FIG. 1, the dashed lines illustrate a target threshold voltage distribution for each of the four states (i.e., the expected distribution of the threshold voltages for memory cells in each of the respective states). As illustrated by the above-described program/erase cycling effects can shift the threshold voltage distribution of programmed memory cells toward a lower voltage, as indicated by the threshold voltage distributions drawn with solid lines in FIG. 1. If this shift is large enough, some of the programmed memory cells may have a threshold voltage that is lower than a program verify voltage (e.g., voltages Read1, Read2 or Read3 in FIG. 1). When this occurs, read operations may fail due to the decrease in read margin that occurs as the threshold voltage of the memory cells is reduced.

The data-retention characteristics of the device are of potential concern because charges (electrons) stored in the device to represent a data bit can leak away from the floating gate through various mechanisms such as thermoionic emission and/or charge diffusion through defective interplay dielectrics, ionic contamination, and/or program disturb stresses. (The opposite effect of charge gain can occur when the floating gate slowly gains electrons with the control gate held at Vcc, thus causing an increase in threshold voltage.) As the threshold voltages of the memory cells decrease over time, it may result in a corresponding decrease in the read margin between states of the flash memory device. This phenomenon is referred to herein as "hot temperature stress" (HTS). With HTS, charges accumulated in the floating gate of a memory cell leak out of the floating gate to, for example, the substrate of the device. As the number of charges accumulated in the floating gate is reduced by this leakage, the threshold voltages of memory cells in respective states drop. The decrease in the threshold voltage (or charge-loss) due to HTS may increase as the amount of charges accumulated in the floating gate is increased. This charge-loss problem is not limited to devices having a floating gate structure. For example, memory devices with a charge trap structure may also suffer from such a charge-loss problem.

Charge-loss due to the above-described program/erase cycling and/or HTS effects causes variation in the threshold voltage distribution of each state. The varied threshold voltage distribution can be restored to an original threshold voltage distribution by the use of re-program (or refresh) operations.

Unfortunately, however, it may be difficult to restore charge-loss induced variations in a threshold voltage distribution by use of such re-program/refresh operations. For example, FIG. 2 illustrates target threshold voltage distributions for each state of a conventional memory device (dashed lines), along with the read voltages Read1, Read2 and Read 3 that define the boundaries between the four states. FIG. 2 also shows how the threshold voltage distribution may change due to, for example, HTS stress and/or cycling. In particular, the solid lines in FIG. 2 illustrate how the threshold voltage distributions may change due to a first amount of charge loss, while the dashed-dotted lines illustrate how the threshold voltage distributions may change due to a second, larger amount of charge loss. As illustrated in FIG. 2, if any memory cell of a programmed state has a threshold voltage lower than a read voltage that is used to determine the state of the memory cell, the memory cell is judged as an on-cell. This causes read error, and a memory block with such read error may be treated as a bad block. Such read errors may occur more frequently as the number of bits of data stored in each memory cell is increased. Furthermore, in a case where threshold voltage distributions of adjacent states are overlapped as illustrated by the threshold voltage distributions drawn using the dashed-dotted lines in FIG. 2, such a problem may become more serious.

SUMMARY

Pursuant to embodiments of the present invention, methods of setting a read voltage of a flash memory device are provided. In each of the methods described herein, the flash memory device may include memory cells that store data by being set to one of a plurality of states. In some embodiments, the plurality of states may be two states in other embodiments, the plurality of states may be more than two states.

Pursuant to certain embodiments of the present invention, the read voltage is set by reading data from a plurality of memory cells of the flash memory device at a plurality of different voltages in order to obtain data regarding a first threshold voltage distribution for ones of the memory cells that are set to a first of the plurality of states and a second threshold voltage distribution for ones of the memory cells that are set to a second of the plurality of states. Then, the read voltage of the flash memory device is set based on the obtained data. In such methods, the plurality of different voltages may be generated, for example, by incrementing or decrementing a starting voltage by a predetermined increment.

In some embodiments, the obtained data may include a maximum threshold voltage for the first of the plurality of states and a minimum threshold voltage for the second of the plurality of states. In such embodiments, the plurality of memory cells may be memory cells of a representative region of a memory cell array of the flash memory device that is representative of the memory cells in a data region of the memory cell array. The read voltage may be set, for example, about halfway between the maximum threshold voltage for the first of the plurality of states and the minimum threshold voltage for the second of the plurality of states.

In other embodiments, the obtained data may comprise a distribution table that identifies, for each of the plurality of different voltages, the number of the plurality of memory cells that are in a first of the plurality of states when read at the respective one of the plurality of different voltages. In such embodiments, the ones of the plurality of different voltages for which a maximum number of the plurality of memory cells are in the first of the plurality of states may be identified based on the obtained data in the distribution table.

Pursuant to further embodiments of the present invention, methods for setting a read voltage in a memory system which comprises a flash memory device are provided. Pursuant to these methods, data is read from a plurality of memory cells of the flash memory device at each of a plurality of different distribution read voltages. Then, the one of the plurality of distribution read voltages for which a maximum number of the plurality of memory cells are in the one of the plurality of states is identified for each of the plurality of states. Then, new read voltages are defined based on the identifications as to the ones of the plurality of distribution read voltages for which a maximum number of the plurality of memory cells are in the one of the plurality of states. In these methods, the plurality of different distribution read voltages are generated by incrementing or decrementing a starting voltage by a predetermined increment.

In some embodiments, the new read voltages may be defined so as to have an intermediate value between adjacent ones of the identified distribution read voltages. These methods may also include carrying out a refresh operation on the flash memory device using the newly defined read voltages and verifying read voltages of each of the plurality of states. Some of these methods may further include providing a distribution read command to the flash memory device, where the read data is output to a memory controller associated with the flash memory device in response to the distribution read command, and where the new read voltages are provided to the flash memory device.

Pursuant to still further embodiments of the present invention, methods of setting a read voltage in a memory system which comprises a flash memory device are provided in which data is read from a plurality of memory cells of the flash memory device at each of a plurality of different margin read voltages. Then, for each of the plurality of states, the minimum and maximum threshold voltages for each of the plurality of states is determined based on the read data from the representative region. Then, new read voltages are defined for each of the plurality of states based on the minimum and maximum threshold voltages for each of the plurality of states.

In these methods, the minimum threshold voltage for each of the plurality of states may correspond to a margin read voltage for which at least one data bit among the read data indicates an erase state, and the maximum threshold voltage for each of the plurality of states may correspond to a margin read voltage for which all of the read data indicates a program state. The data may be read from a representative region of the flash memory device. The plurality of margin read voltages may be generated by incrementing or decrementing a starting voltage by a predetermined increment.

Other embodiments of the present invention are directed to methods for setting a read voltage in a memory system which comprises a flash memory device and a memory controller for controlling the flash memory device. These methods comprise sequentially varying a distribution read voltage to read page data from the flash memory device; constituting a distribution table having a data bit number and a distribution read voltage, the data bit number indicating an erase state among the page data respectively read from the flash memory device and the distribution read voltage corresponding to the read page data; detecting distribution read voltages corresponding to data bit numbers each indicating maximum points of possible cell states of a memory cell, based on the distribution table; and defining new read voltages based on the detected distribution read voltages.

Still other exemplary embodiments of the present invention are directed to data restore methods of a memory system which comprises a flash memory device and a memory controller for controlling the flash memory device. These methods comprise providing a distribution read command to the flash memory device; sequentially varying a distribution read voltage to output page data to the memory controller, at an input of the distribution read command; generating a distribution table having a data bit number and a distribution read voltage, the data bit number indicating an erase state among the page data respectively read from the flash memory device and the distribution read voltage corresponding to the read page data; detecting distribution read voltages corresponding to data bit numbers each indicating maximum points of possible cell states of a memory cell, based on the distribution table; defining new read voltages based on the detected distribution read voltages; providing the newly defined read voltage to the flash memory device; and performing a refresh operation using the newly defined read voltages and verify read voltages of the respective cell states.

Still other exemplary embodiments of the present invention are directed to methods of setting a read voltage in a memory system which comprises a flash memory device; and a memory controller for controlling the flash memory device. These methods may comprise sequentially varying a margin read voltage to read respective page data from a representative region of the flash memory device; determining minimum and maximum threshold voltages of each of possible cell states of a memory cell based on the page data from the representative region and the sequentially varied margin read voltages; and defining new read voltages of the cell states based on the minimum and maximum threshold voltages of the respective cell states, wherein the minimum threshold voltage of each cell state corresponds to a margin read voltage when at least one data bit among the page data respectively read from the flash memory device indicates an erase state, and the maximum threshold voltage of each cell state corresponds to a margin read voltage when the page data respectively read from the flash memory device all indicates a program state. Alternatively, the maximum threshold voltage of each cell state corresponds to a margin read voltage when at least one data bit among the page data respectively read from the flash memory device indicates a program state, and the minimum threshold voltage of each cell state corresponds to a margin read voltage when the page data respectively read from the flash memory device all indicates an erase state.

Still further embodiments of the present invention are directed to data restore methods of a memory system which comprises a flash memory device and a memory controller for controlling the flash memory device. These data restore methods may comprise providing a wear-leveling read command to the flash memory device; judging whether a maximum wear-leveling value exceeds a wear-leveling reference value, based on a wear-leveling table from the flash memory device; if the maximum wear-leveling value exceeds the wear-leveling reference value, checking a charge-loss state with respect to a representative region of the flash memory device; and providing read voltages newly defined according to the checked charge-loss state to the flash memory device to restore charge-lost memory cells.

While embodiments of the present invention have been discussed above in terms of methods, it will also be appreciated that other embodiments of the present invention include flash memory devices and memory systems that carry out the above-described methods and electronic devices that include such flash memory devices and memory systems.

BRIEF DESCRIPTION OF THE DRAWINGS

FIG. 4 is a schematic diagram illustrating characteristics of the representative region of memory cell arrays according to certain embodiments of the present invention.

FIG. 5 is a diagram showing a data pattern stored in a register included in the memory system of FIG. 4.

DETAILED DESCRIPTION

Figure 1:
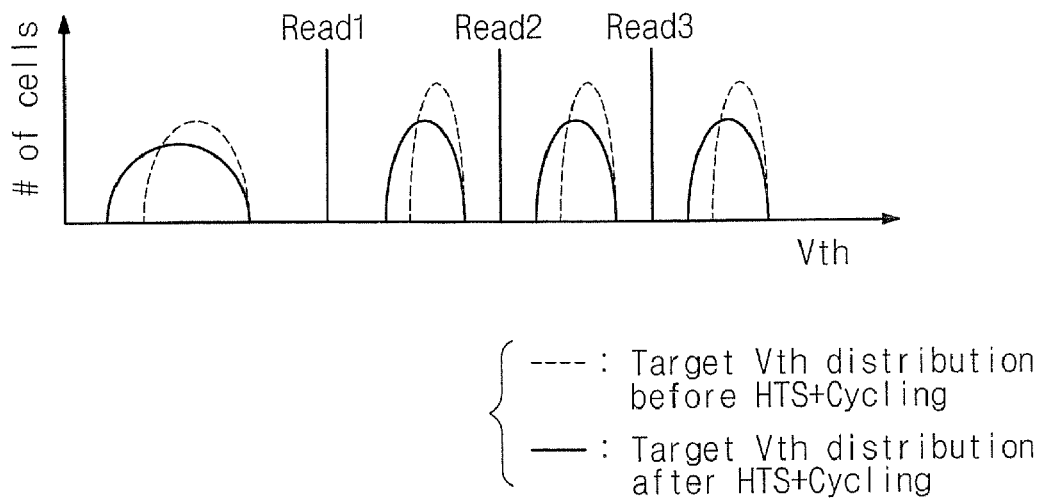
FIG. 1 is a diagram showing threshold voltage distributions for each state of memory cells of a conventional flash memory device that stores multi-level data.
Figure 2:
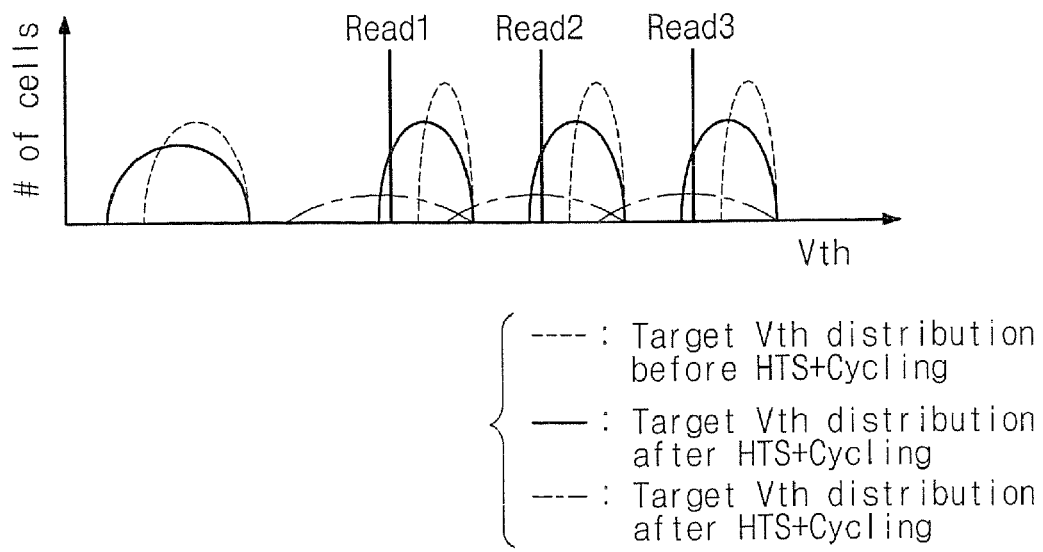
FIG. 2 is a diagram illustrating how the threshold voltage distribution of the conventional flash memory device of FIG. 1 may vary as a result of charge-loss.

Embodiments of the present invention will now be described more fully hereinafter with reference to the accompanying drawings, in which embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the term-s first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between", "adjacent" versus "directly adjacent", etc.).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, operations, elements, and/or components, but do not preclude the presence or addition of one or more other features, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this disclosure and the relevant art and will not be interpreted in an idealized or overly formal sense unless expressly so defined herein.

Certain embodiments of the present invention are described herein with reference to flowchart diagrams. It will be understood that in some embodiments, the operations noted in the flowcharts may occur out of the order noted in the flowcharts. For example, two blocks shown in succession may in fact be executed substantially concurrently or the blocks may sometimes be executed in the reverse order, depending upon the operations involved. Moreover, the functionality of one or more blocks may be separated and/or combined with that of other blocks.

While flash memory devices have certain advantages such as providing high levels of integration and the ability to retain data after the power is cut off, flash memory devices also may have certain disadvantages as compared to general storage devices such as hard drives. One such disadvantage is that conventional flash memory devices do not allow data at an original address to be directly overwritten with new data. Instead, since each bit of the flash memory device is toggled toward one direction (e.g., to store a logic value "1" or a logic value "0"), an erase operation is carried out before a cell is re-programmed with new data. Since the number of erase operations that may be performed on a memory block of a flash memory device is limited, the usable memory space can be reduced when the memory blocks of the flash memory device are not used uniformly. Cleaning policy and wear-leveling techniques may be used in order to more effectively use flash memory devices. As discussed below, memory systems and methods according to embodiments of the present invention may implement wear-leveling techniques that may lengthen the service span of the system by uniformly distributing the erase/program operations across all of the memory blocks of the flash memory device. These wear-leveling techniques may be used to restore data in memory cells that have suffered excessively large charge-lost due to, for example, the cycling and/or HTS effects described above.

Figure 3:
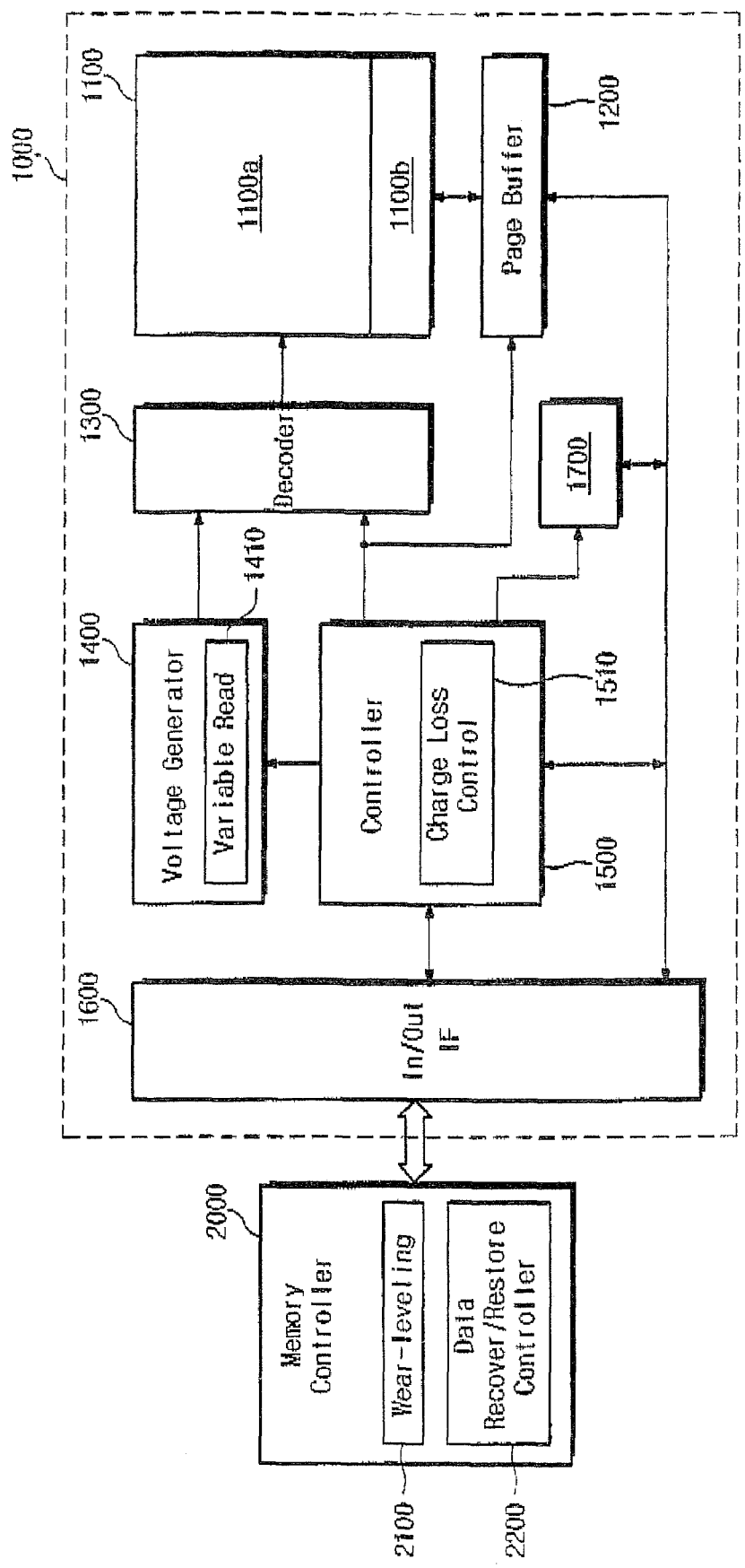
FIG. 3 is a block diagram of a memory system according to embodiments of the present invention.

FIG. 3 is a block diagram illustrating a memory system according to certain embodiments of the present invention. As shown in FIG. 3, the memory system includes a flash memory device 1000 and a memory controller (or flash controller) 2000. In some embodiments, the flash memory device 1000 may be a NAND flash memory device. However, it will be appreciated that other types of flash memory devices may also be used.

The flash memory device 1000 includes a memory cell array 1100. Each memory cell in the memory cell array may store M-bit data (where M is an integer that is greater than or equal to 1). As shown in FIG. 3, the memory cell array 1100 may be divided into multiple regions, including a data region 1100a in which general data is stored and a "representative region" 1100b that is used to represent the charge-loss state of memory cells in the data region 1100a. The regions 1100a and 1100b of the memory cell array 1100 may each include a plurality of memory blocks. A memory block structure is well known in the art, and description thereof is thus omitted. The memory cell array 1100 may also include a region for storing a wear-leveling table. Hereinafter, this region is referred to as the "wear-leveling table region." In some embodiments, the wear-leveling table region may be formed as part or all of a selected memory block or blocks in the data region 1100a. In other embodiments, the wear-leveling table region may be formed in a spare region of each memory block in the data region 1100a. In still other embodiments, the wear-leveling table region may be formed elsewhere such as, for example, in a separate non-volatile memory circuit such as, for example, a read only memory (ROM).

As is also shown in FIG. 3, the flash memory device 1000 may further include a page buffer circuit 1200, a decoder circuit 1300, a voltage generator circuit 1400, a controller circuit 1500, and an input/output interface circuit 1600. The page buffer circuit 1200 may be configured to read/program data from/to the memory cell array 1100 under the control of the controller circuit 1500. The decoder circuit 1300 may also be controlled by the controller circuit 1500, and may be configured to select a memory block of the memory cell array 1100 and a word line of the selected memory block. The selected word line is driven with a word line voltage that may be provided by the voltage generator circuit 1400. The voltage generator circuit 1400 may also be controlled by the controller circuit 1500, and may be configured to generate a word line voltage (e.g., a read voltage, a program voltage, a pass voltage, a verify voltage, or the like) that is supplied to the memory cell array 1100. The voltage generator circuit 1400 may include a read voltage generator 1410 that generates the read voltages needed for discriminating between different states. The read voltage generator 1410 may accomplish this, for example, by sequentially increasing or decreasing a read voltage by an increment/decrement according to the control of the controller circuit 1500. The controller circuit 1500 may also be configured to control the overall operation of the flash memory device 1000. The controller circuit 1500 may include a charge-loss controller 1510 that operates responsive to commands from the memory controller 2000, as is more fully described below.

The memory controller 2000 according to some embodiments of the present invention may be configured to control the flash memory device 1000 in response to a request from an external source such as, for example, a host. Although not shown in figures, the memory controller 2000 may include a processing unit (such as a central processing unit or a microprocessor), an error correction circuit, a buffer memory, and the like, which are well known in the art. The memory controller 2000 according to embodiments of the present invention may further include a register 2100 for storing a table of wear-leveling values and a data recover/restore controller

2200. The register 2100 may be used to store a table of wear-leveling values of memory blocks that are provided from the wear-leveling table region of the flash memory device 1000. The data recover/restore controller 2200 may be configured to generate a wear-leveling read command, a representative region read command (or, a margin read command), a restore command and a stress program command. The wear-leveling read command is used to read wear-leveling values that are stored, for example, in the memory cell array 1100, and the representative region read command is used to read memory cells in the representative region 1100b. The stress program command may be used to erase and program the representative region 1100b, and the restore command may be used to perform a re-program operation (or a refresh operation) of memory cells in the data region 1100a.

In exemplary embodiments, the flash memory device 1000 may further include a data pattern storing circuit 1700 that stores a data pattern that is to be programmed into the representative region 1100b. The data pattern storing circuit 1700 may comprise, for example, a read only memory (ROM), a static random access memory (SRAM) or any of a variety of other types of memory devices. In some embodiments, such as in embodiments in which the data pattern storing circuit 1700 is formed of a register such as an SRAM, the data pattern may be stored in the memory cell array 1100. The data pattern stored in the memory cell array 1100 may then be loaded into the data pattern storing circuit 1700 as necessary. It will be appreciated that the data pattern storing circuit 1700 may be realized in the memory controller 2000 instead of the flash memory device 1000.

FIG. 4 is a schematic diagram illustrating characteristics of the representative region 1100b of the memory cell array 1100 of FIG. 3. As shown in FIG. 4, the capacity of the representative region 1100b of the memory cell array 1100 may be smaller than the capacity of the data region 1100a. Memory blocks in the representative region 1100b may be erased and programmed whenever a wear-leveling value (i.e., a maximum wear-leveling value) is present in wear-leveling data. As will be discussed in more detail herein, by erasing and programming the memory blocks in the representative region each time that, for example, a maximum wear-leveling value is present in the wear-leveling data, the condition of the memory blocks in the representative region 1100b may accurately track the condition of the memory blocks in the data region 1100a. As such, the threshold voltage distribution of memory cells in the representative region 1100b may be indicative of the threshold voltage distribution of memory cells in the data region 1100a.

FIG. 5 is a diagram illustrating an exemplary data pattern that may be stored in the data pattern storing circuit 1700 of FIG. 3. The data pattern that is stored in the data pattern storing circuit 1700 may be used to determine whether data read from the representative region 1100b is data of charge-lost memory cells, as will be described below. As shown in FIG. 5, one word line (e.g., WL0) may correspond to a plurality of pages (two pages in the example of FIG. 5). In the embodiment of FIG. 5, one page is assigned to store least significant bit (LSB) data, and the other is assigned to store most significant bit (MSB) data. Methods for reading and programming LSB and MSB data are well known in the art, and description thereof is thus omitted. Charge-lost data may be identified by comparing data read from the data pattern storing circuit 1700 with data read from a selected page. The data pattern in the data pattern storing circuit 1700 may be used as data to be programmed in the representative region 1100b. As described above, the data pattern storing circuit 1700 can be provided within memory controller 2000 in FIG. 3.

Figure 6:
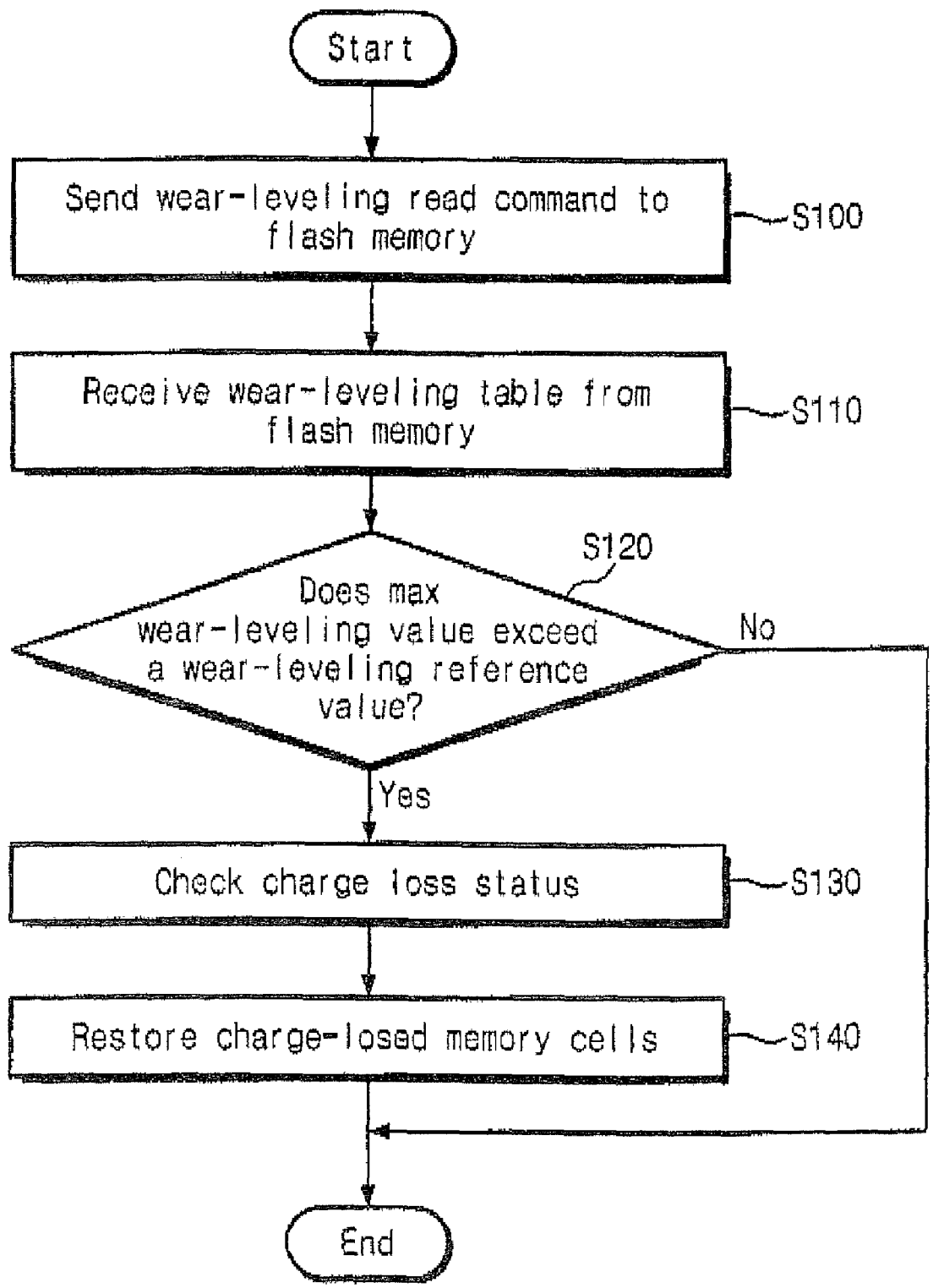
FIG. 6 is a flowchart illustrating operations for restoring data in a memory system according to certain embodiments of the present invention.

FIG. 6 is a flowchart illustrating methods of restoring data (i.e., "data restore operations") according to certain embodiments of the present invention. As shown in FIG. 6, operations may begin with the memory controller 2000 sending a wear-leveling read command to the flash memory device 1000 (S100). This command may be sent, for instance, at power-up of the memory system or at other times such as, for example, in response to a request from a host device or based on the lapse of a timer (which may be provided, for example, within the memory controller 2000).

In response to the wear-leveling read command, the flash memory device 1000 reads a table (i.e., a wear-leveling table) that includes wear-leveling values of respective memory blocks that are stored in the memory cell array 1100. The memory controller 2000 receives the read wear-leveling table provided from the flash memory device 1000 (S110). The operation(s) for reading the wear-leveling table may be controlled by the charge-loss controller 1510. The wear-leveling table received by the memory controller 2000 from the flash memory device 1000 may be stored in the register 2100 of the memory controller 2000. Then, a determination may be made as to whether a maximum one of the wear-leveling values in the register 2100 exceeds a wear-leveling reference value (S120). This determination may be made by, for example, the data recovering/restore controller 2200 of the memory controller 2000.

The wear-leveling reference value may represent the total number of times that the memory blocks have been programmed and erased. In some embodiments of the present invention, the wear-leveling reference value may be set to 10,000. However, it will be appreciated that the wear-leveling reference value can be set to any value. The wear-leveling value may be single-bit data. However, memory cells in regions 1100a and 1100b may store single-bit data or N-bit data (where N is an integer value greater than or equal to 2).

As shown in FIG. 6, if at block S120 it is determined that the maximum wear-leveling value is less than the wear-leveling reference value, the method illustrated in FIG. 6 may be completed, and the memory system may enter, for example, a standby state. If, on the other hand, it is determined that the maximum wear-leveling value exceeds the wear-leveling reference value at block S120, the charge-loss state of all of the memory cells in the representative region 1100b of the memory cell array 1100 is checked (S130). A restore operation (i.e., a refresh/re-program operation) is then performed on the identified charge-lost memory cells (S140) to complete the procedure.

Figure 7:
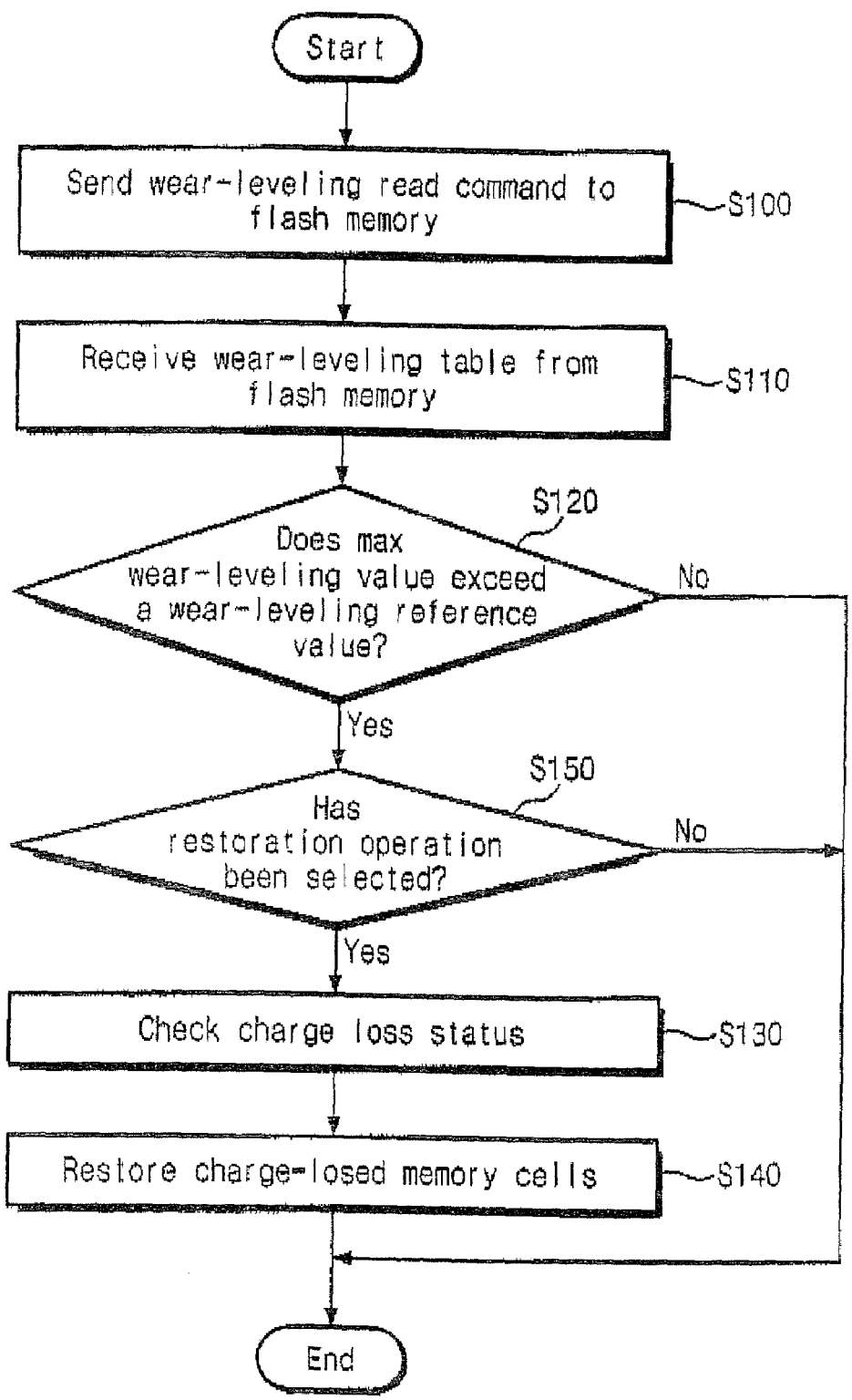
FIG. 7 is a flowchart illustrating operations for restoring data in a memory system according to further embodiments of the present invention.

FIG. 7 is a flowchart illustrating methods of restoring data according to further embodiments of the present invention. In FIG. 7, the operations of blocks S100, S110, S120, S130 and S140 are identical to the identically numbered blocks of FIG. 6, and hence further description of these blocks will be omitted here. However, in the methods of FIG. 7, an additional operation S150 may be included if it is determined that the maximum wear-leveling value exceeds the wear-leveling reference value. In operation S150, a determination is then made as to whether a refresh/re-program operation is selected. By way of example, after operation S120, the memory controller 2000 may inform a host that the maximum wear-leveling value exceeds the wear-leveling reference value, and the host may display a selection of the refresh/re-program operation through a user interface. If the refresh/re-program operation is selected, the host informs the memory controller 2000 that the refresh/re-program operation is selected. The memory controller 2000 may then respond to the selection of the refresh/re-program operation by performing the operations of blocks S130 and S140 in the same manner as described above.

Figure 8:
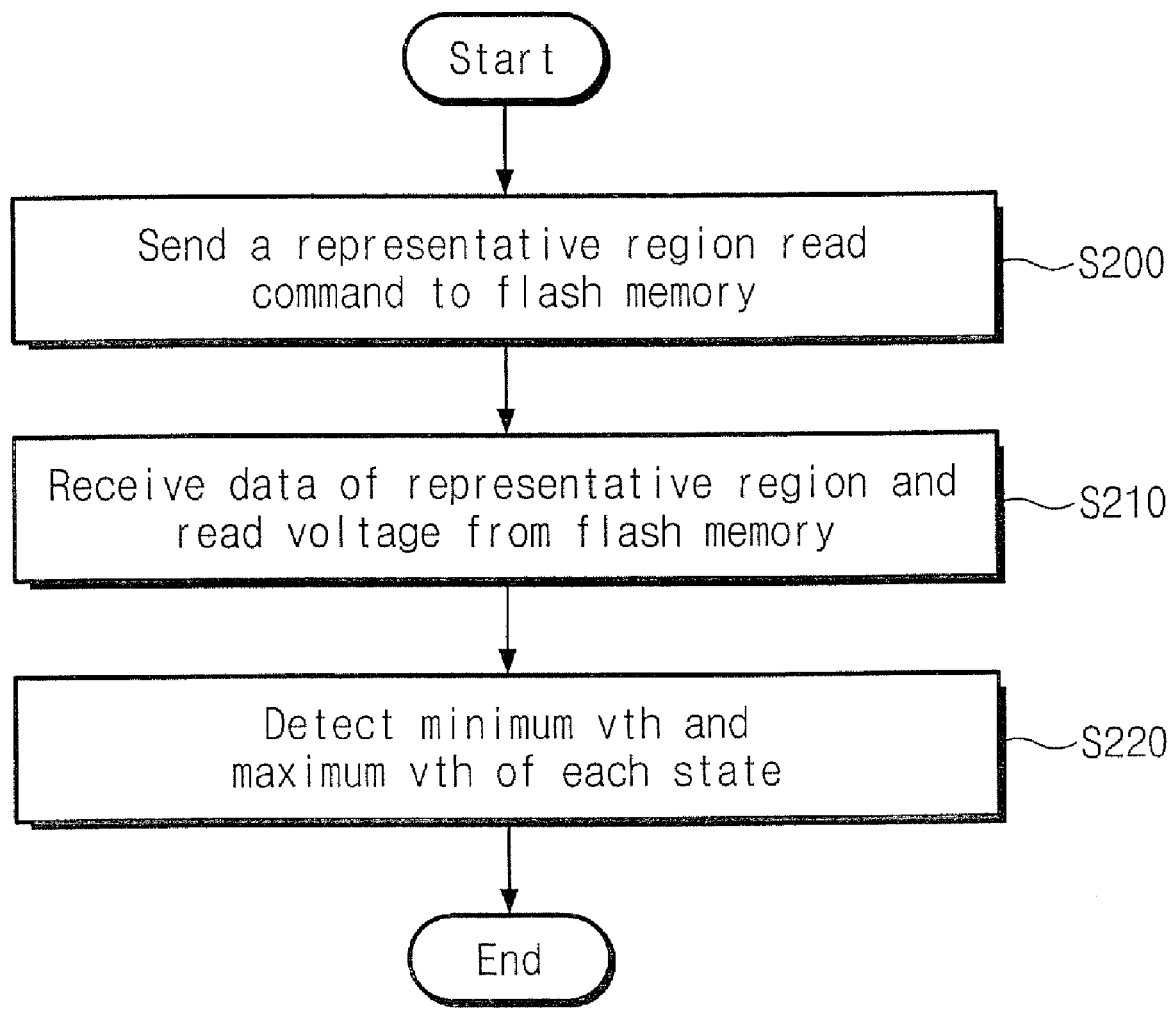
FIG. 8 is a flowchart illustrating operations that may be used to check the charge-loss state of memory cells according to certain embodiments of the present invention.
Figure 9:
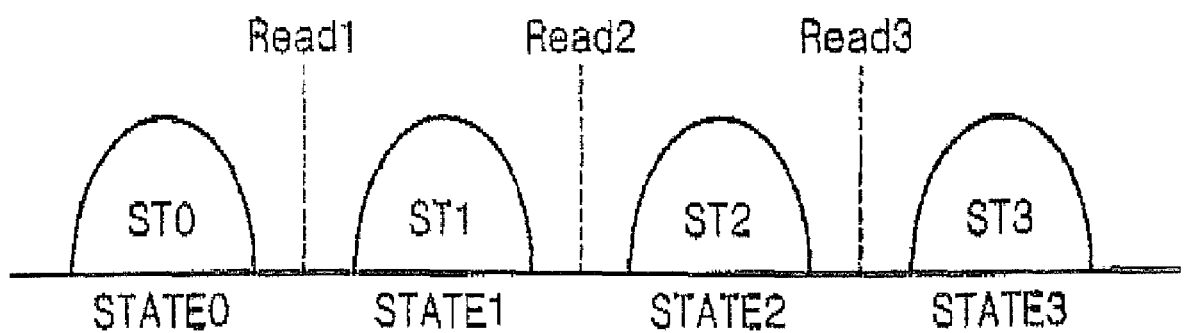
FIG. 9 is a diagram showing threshold voltage distributions of a memory cell storing 2-bit data.
Figure 10:
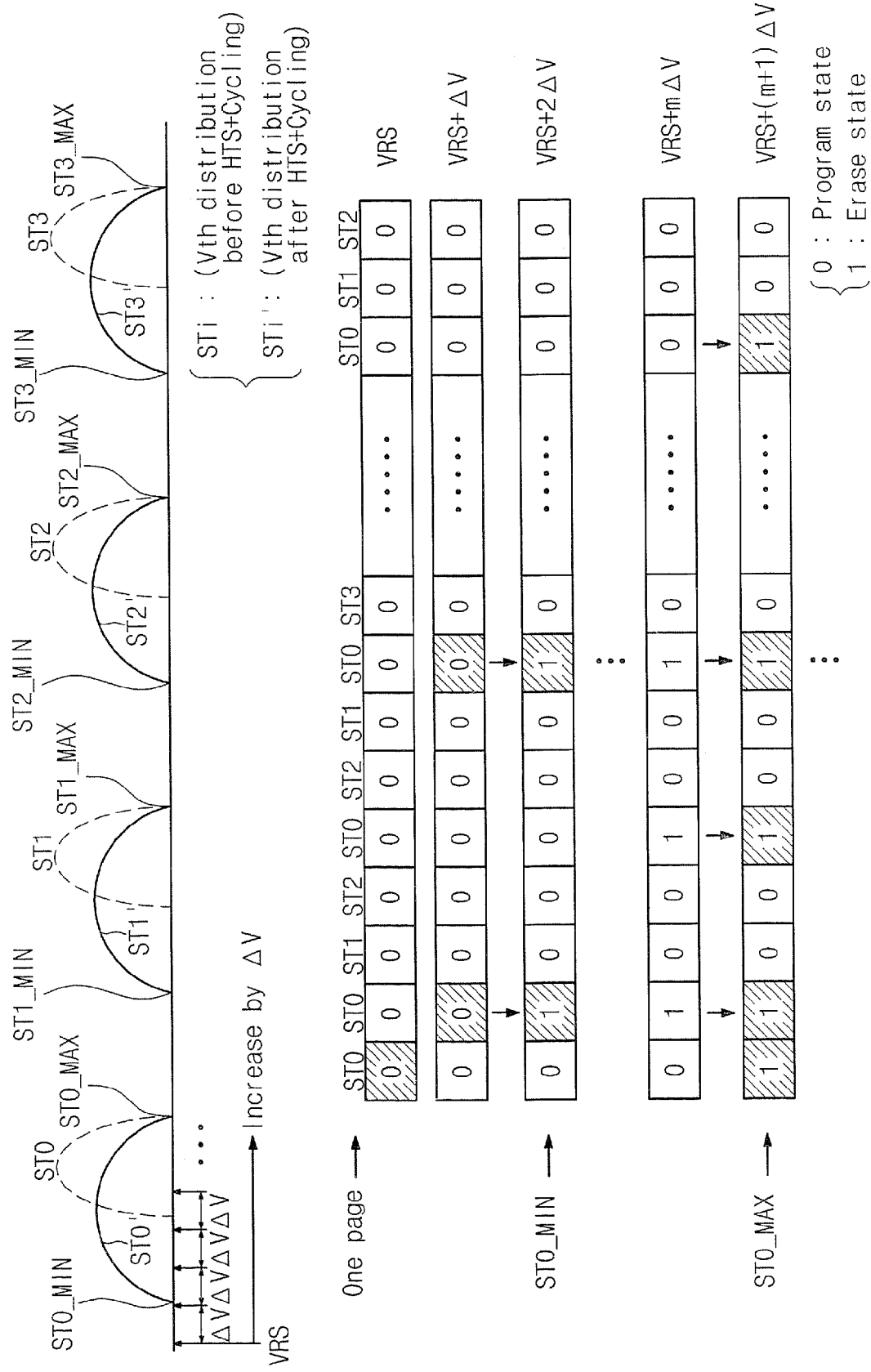
FIG. 10 is a diagram showing read voltages, threshold voltage distributions and page buffer states during operations that are used to check the charge-loss state according to certain embodiments of the present invention.

FIG. 8 is a flow chart illustrating operations according to certain embodiments of the present invention that may be performed to check the charge-loss state of the memory cells in the representative region 1100b of the memory cell array 1100 (i.e., to perform the operation illustrated in block S130 of FIGS. 6 and 7). FIG. 9 is a diagram showing threshold voltage distributions of a memory cell that stores 2-bit data. FIG. 10 is a diagram showing read voltages, threshold voltage distributions and page buffer states during the operations illustrated in the flowchart of FIG. 8. Hereinafter, operations for checking a charge-loss state of a memory system according to certain embodiments of the present invention are more fully described with reference to FIGS. 8-10.

As shown in FIG. 8, a representative region read command (which is also referred to as a "margin read command") may be sent to the flash memory device 1000 by, for example, the memory controller 2000 (S200). In response to this representative region read command, the flash memory device 1000 outputs to the memory controller 2000 each page of data stored in the representative region 1100b along with a read voltage of each page (S210). The memory controller 2000 then determines/detects minimum and maximum threshold voltage values for each state based on the received data and the corresponding read voltages provided from the flash memory device 1000 (S220).

Operations which may be used to determine/detect the minimum and maximum threshold voltage values for each state according to certain embodiments of the present invention will now be explained with reference to FIGS. 9 and 10. In this example, each memory cell in the memory cell array 1100 stores 2-bit data, and thus each memory cell may be in one of four states (STATE 0, STATE 1, STATE 2 or STATE 3). As shown in FIG. 9, each state has an associated threshold voltage distribution ST0, ST1, ST2 or ST3, which represents the expected distribution of the threshold voltages of memory cells that are programmed in each respective state. By comparing a threshold voltage of a memory cell to the voltage levels Read1, Read2 and Read 3, it is possible to determine the state of any particular memory cell. Operations that may be used to detect a maximum threshold voltage and a minimum threshold voltage of the threshold voltage distributions of the memory cells in each of STATE 0, STATE 1, STATE 2 and STATE 3 will now be described with respect to FIG. 10.

In FIG. 10, the threshold voltage distributions ST0, ST1, ST2 and ST3 that are drawn using dotted lines represent the threshold voltage distributions for STATE 0, STATE 1, STATE 2 and STATE 3, respectively, before HTS and cycling has occurred. Likewise, the threshold voltage distributions ST0', ST1', ST2' and ST3' that are drawn using solid lines represent the threshold voltage distributions for STATE 0, STATE 1, STATE 2 and STATE 3, respectively, after HTS and cycling has occurred. As is also shown in FIG. 10, a start read voltage VRS may be determined that is lower than the minimum threshold voltage of threshold voltage distribution ST0'. This start read voltage VRS may be provided by the variable read voltage generator 1410 under the control of the charge-loss controller 1510 (see FIG. 3). The start read voltage VRS (the "margin read voltage") may be supplied to a selected word line of the representative region 1100b so that a read operation is performed on the selected word line through the page buffer circuit 1200. The data read in this operation is transferred to the memory controller 2000, along with an indication as to the voltage-level that was supplied to the selected word line (i.e., VRS, VRS+ΔV, VRS+2ΔV, etc.) during this read operation.

As illustrated in FIG. 10, after each read operation is completed, the charge-loss controller 1510 may then control the variable read voltage generator 1410 to generate a read voltage that is increased by an increment ΔV. This increment ΔV may be a predetermined increment. The read voltage thus generated (i.e., VRS+ΔV) may be supplied to the selected word line of the representative region 1100b so that another read operation is performed on the selected word line through the page buffer circuit 1200. The read data is again transferred to the memory controller 2000, along with an indication as to the voltage-level that was supplied to the selected word line (i.e., VRS+ΔV). As indicated in FIG. 10, the read voltage is again incremented by ΔV and the above described operations are repeated until a read voltage is reached that is higher than the highest read voltage in the threshold voltage distribution ST3'.

As illustrated in FIG. 10, initially the read data values may have data '0' (corresponding to a program state). Whether each of the read data values has any state is determined by use of a data pattern stored in a data pattern storing circuit 1700 of FIG. 3. As the margin read operations are repeated as described above, eventually at least one of read data values that correspond to STATE 0 is changed into data '1' (corresponding to an erase state). This means that at least one memory cell in STATE 0 is judged as a memory cell having an erase state. At this time, the memory controller 2000 may determine a read voltage that may be used in read operations to represent the minimum threshold voltage for STATE 0 (e.g., ST0_MIN). As the margin read operation continues, eventually all of the read data values that correspond to STATE 0 change into data '1'. This means that all memory cells in STATE 0 are judged as having an erase state at the current read voltage level. At this time, the memory controller 2000 may determine a read voltage that may be used in read operations to represent the maximum threshold voltage for STATE 0 (e.g., ST0_MAX). As the margin read operation is continued by repeating the above operations with the read voltage incremented each time by ΔV, minimum and maximum threshold voltages STi_MIN and STi_MAX (i=1 to 3) for STATES 1, 2 and 3 (after HTS and cycling) may similarly be determined.

Figure 11:
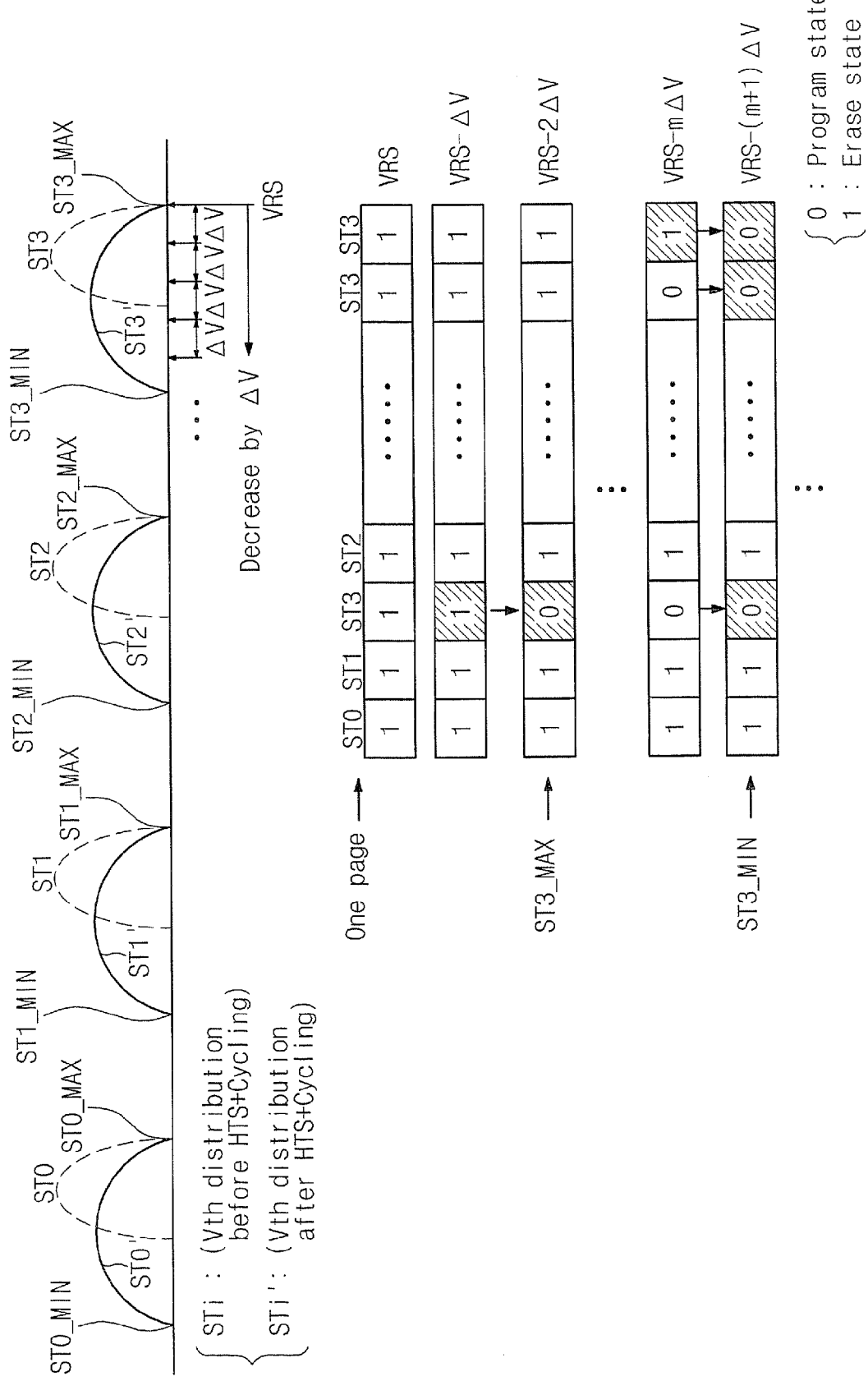
FIG. 11 is a diagram showing read voltages, threshold voltage distributions and page buffer states during operations that are used to check the charge-loss state according to further embodiments of the present invention.

FIG. 11 illustrates operations that may be used to detect minimum and maximum threshold voltages of the threshold voltage distributions of the memory cell in each of the states ST0, ST1, ST2 and ST3 according to further embodiments of the present invention. As illustrated in FIG. 11, in these further embodiments of the present invention, the start read voltage VRS may be a read voltage that is higher than the highest read voltage in the threshold voltage distribution ST3'. Operations according to the embodiments of FIG. 11 are very similar to the operations explained above with respect to FIG. 10, except that in the embodiments according to FIG. 11 the read voltage may be decreased by a predetermined decrement. In these embodiments, initially the read data values may have data '1' indicating an erase state. As the margin read operations continue, eventually at least one of the read page data bits that corresponds to STATE 3 is changed into data '0' indicating a program state. At this time, the memory controller 2000 may determine a read voltage that may be used in read operations as a maximum threshold voltage for STATE 3 (i.e., ST3_MAX). As the margin read operation is continued by repeating the above operations with the read voltage decremented each time by ΔV, minimum and maximum threshold voltages STi_MIN (i=0 to 3) and STi_MAX (i=0 to 2) may similarly be determined.

Figure 12:
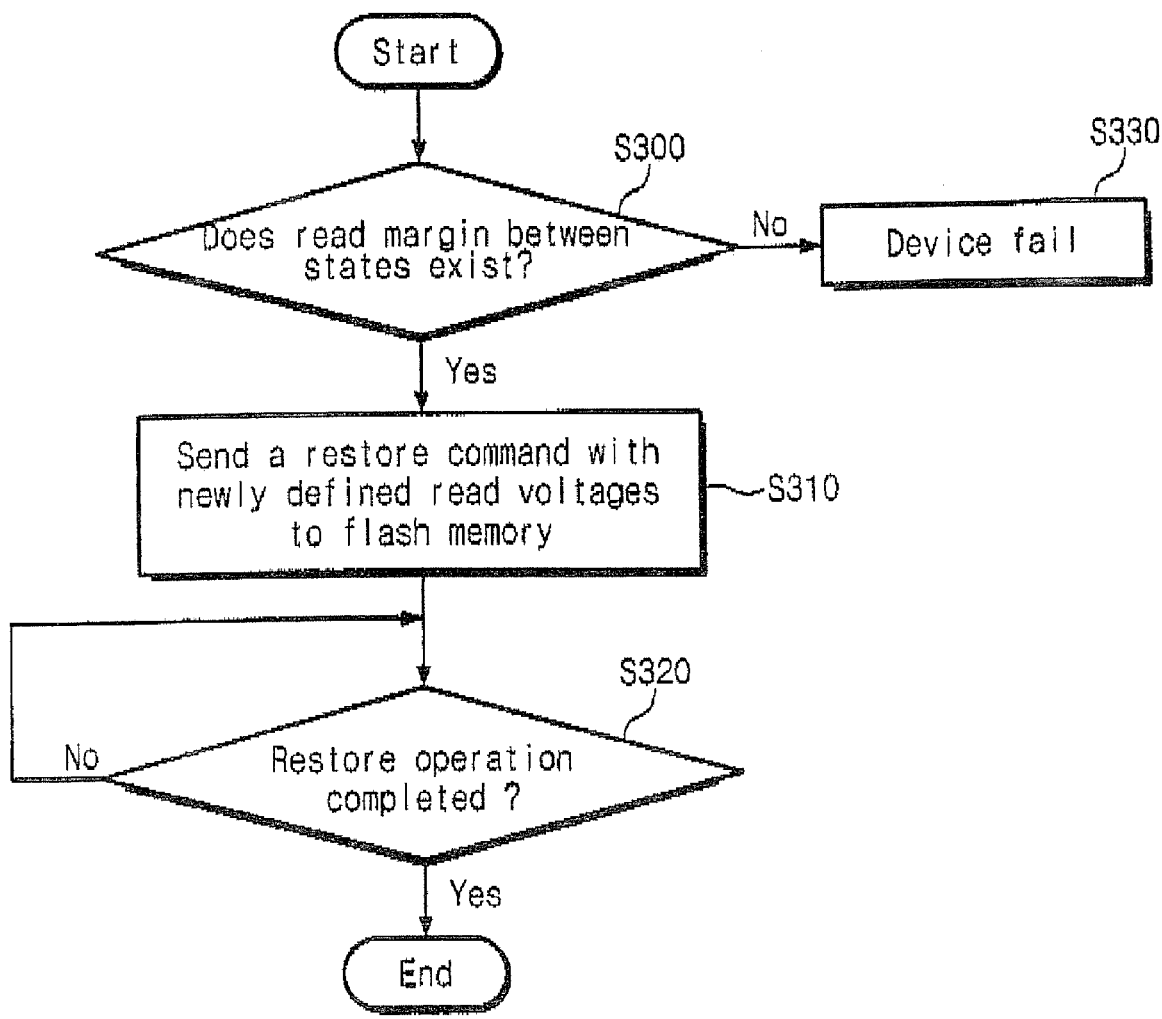
FIG. 12 is a flowchart illustrating operations that may be used to perform of the data restore operations illustrated in FIGS. 6 and 7 according to certain embodiments of the present invention.
Figure 13:
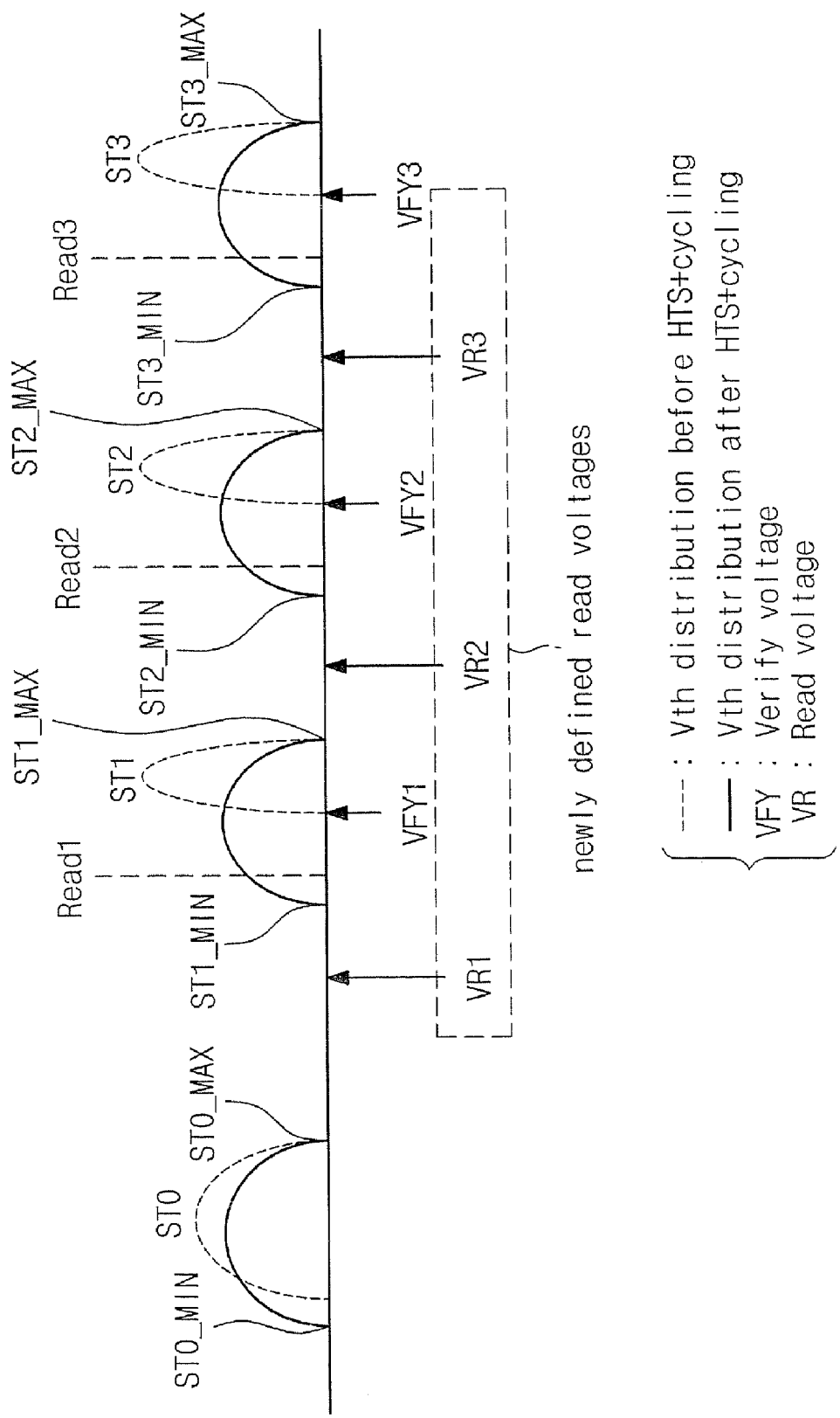
FIG. 13 is a diagram showing relationships between threshold voltage distributions and newly defined read voltages according to certain embodiments of the present invention.

FIG. 12 is a flowchart that illustrates operations that may be used to perform the restore/refresh operation of block S140 of FIGS. 6 and 7 according to certain embodiments of the resent invention. FIG. 13 is a diagram showing relationships between threshold voltage distributions and newly defined read voltages according to certain embodiments of the present invention. Hereinafter, data restore operations of memory systems according to certain embodiments of the present invention will be more fully described with reference to FIGS, 12 and 13.

As shown in FIG. 12, operations may begin with the memory controller 2000 determining whether a read margin exists between adjacent states (S300). Whether a read margin exists between adjacent states may be determined, for instance, using the minimum and maximum threshold voltages of each state of the memory cells in the representative region 1100b that are obtained according to the margin read operations described above with respect to FIGS. 8-10. For example, if the determined minimum threshold voltage ST3_MIN of STATE 3 is greater than the determined maximum threshold voltage ST2_MAX of the STATE 2, then a read margin exists between adjacent STATES 2 and 3. Likewise, it is possible to determine if a read margin exists between STATE 2 and STATE 1 and between STATE 1 and STATE 0.

As shown in FIG. 12, if it is determined that no read margin exists between at least one pair of adjacent states, the flash memory device 1000 may be treated as a failed device (S330). If, on the other hand, a read margin exists between adjacent states, the memory controller 2000 may define new read voltages (e.g., VR1, VR2 and VR3) (refer to FIG. 13) using the detected read margins. Each newly defined read voltage may be an intermediate value between the maximum threshold voltage of one state and the minimum threshold voltage of the next higher adjacent state. The memory controller 2000 may send the newly defined read voltages VR1, VR2 and VR3 together with a restore/refresh command to the flash memory device 1000 (S310). The flash memory device 1000 may then perform a restore/refresh operation for memory cells in the data region 1100a using the newly defined read voltages VR1, VR2 and VR3.

For example, a threshold voltage distribution ST3' of STATE 3 may be restored to the threshold voltage distribution ST3 that existed before HTS and cycling by detecting memory cells having threshold voltages for STATE 3 that are between the newly defined read voltage VR3 and a verify voltage VFY3 (see FIG. 13) and reprogramming the detected memory cells. Likewise, a threshold voltage distribution ST2' of STATE 2 may be restored to the threshold voltage distribution ST2 that existed before HTS and cycling by detecting memory cells having threshold voltages for STATE 2 that are between the newly defined read voltage VR2 and a verify voltage VFY2 (see FIG. 13) and reprogramming the detected memory cells. A threshold voltage distribution ST1' of STATE 1 may be restored to the threshold voltage distribution ST1 that existed before FITS and cycling by detecting memory cells having threshold voltages for STATE 1 that are between the newly defined read voltage VR1 and a verify voltage VFY1 (see FIG. 13) and reprogramming the detected memory cells. STATE 0 is an erase state, and a restore operation of a threshold voltage distribution for the STATE 0 may be carried out selectively. Afterwards, the memory controller 2000 may determine whether a restore operation of the flash memory device 1000 has been completed ended (S320).

When a restore operation of the flash memory device 1000 is complete, the procedure is ended.

Figure 14:
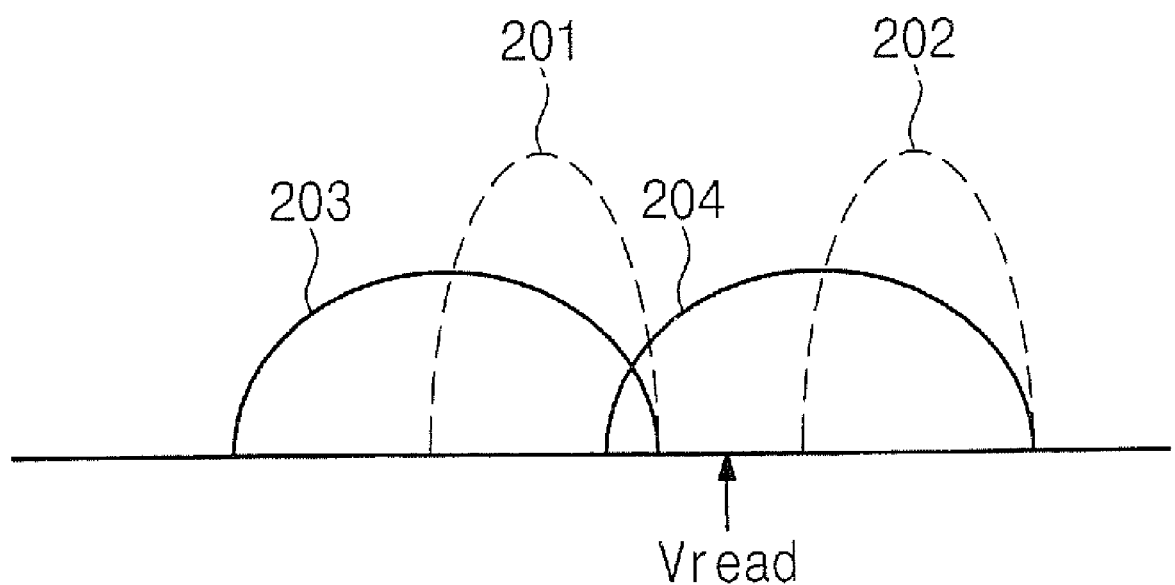
FIG. 14 is a diagram illustrating how threshold voltage distributions of adjacent states may overlap due to excessive charge-loss.

As illustrated in FIG. 14, in a case where threshold voltage distributions 203 and 204 of adjacent states overlap due to excessive charge-loss, it may be difficult to restore charge-lost memory cells using the above-described data restore operations. Further embodiments of the present invention which may be used to restore such charge-lost memory cells will now be described below.

Figure 15:
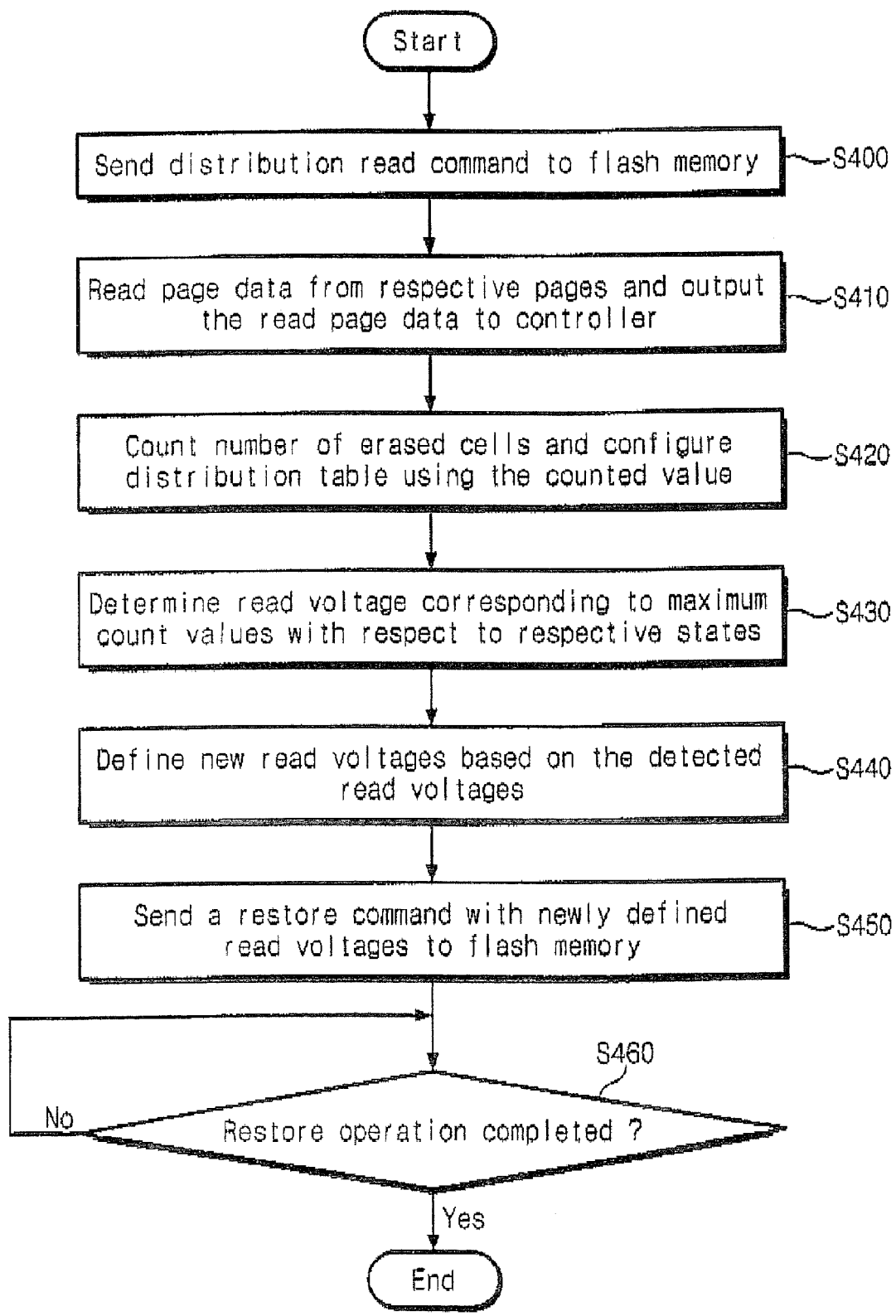
FIG. 15 is a flowchart for describing a data restore operation according to another embodiment of the present invention.
Figure 16:
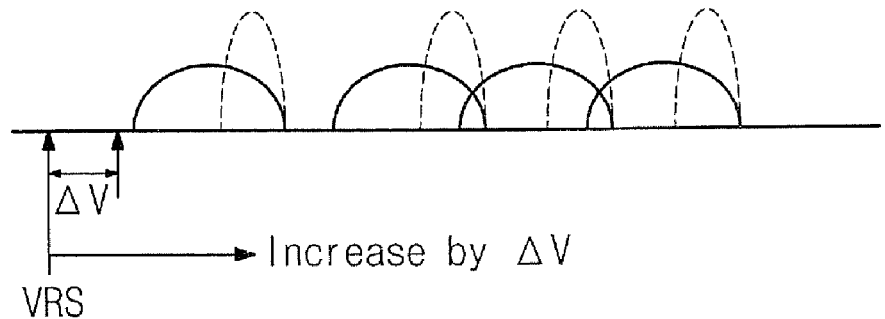
FIG. 16 is a diagram showing how the read voltage may be varied and illustrating a distribution table that may be used in performing the data restore operation illustrated in FIG. 15.

FIG. 15 is a flowchart illustrating data restore operations according to further embodiments of the present invention. FIG. 16 is a diagram showing variations in read voltage and a distribution table according to the data restore operation illustrated in FIG. 15.

As shown in FIG. 15, operations may begin with the memory controller 2000 sending a distribution read command to the flash memory device 1000 (S400). The distribution read command may be generated in a variety of ways. For example, in some embodiments, the distribution read command can be generated based on a number of program/erase operations that have occurred. In other embodiments, the distribution read command can be generated in response to a request from an external device (e.g., a host). The distribution read command may also be generated in other ways. The flash memory device 1000 responds to the distribution read command by reading page data from respective pages of a memory cell array 1100 as follows. The read page data is sent to the memory controller (S410). In response to receipt of the distribution read command, the charge-loss controller 1510 may control the variable read voltage generator 1410 so as to generate a predetermined start read voltage VRS (see FIG. 16). The generated read voltage (i.e., the distribution read voltage) may be supplied to a word line selected by a decoder circuit 1300. The page buffer circuit 1200 reads page data from memory cells of the selected word line, and the read page data is transferred to the memory controller 2000 together with the read voltage. The distribution read voltage is then increased (or, in other embodiments, decreased), and the read operations may be repeated with respect to the memory cells of the selected word line. This process may be continued until an ending distribution read voltage is reached.

Figure 17:
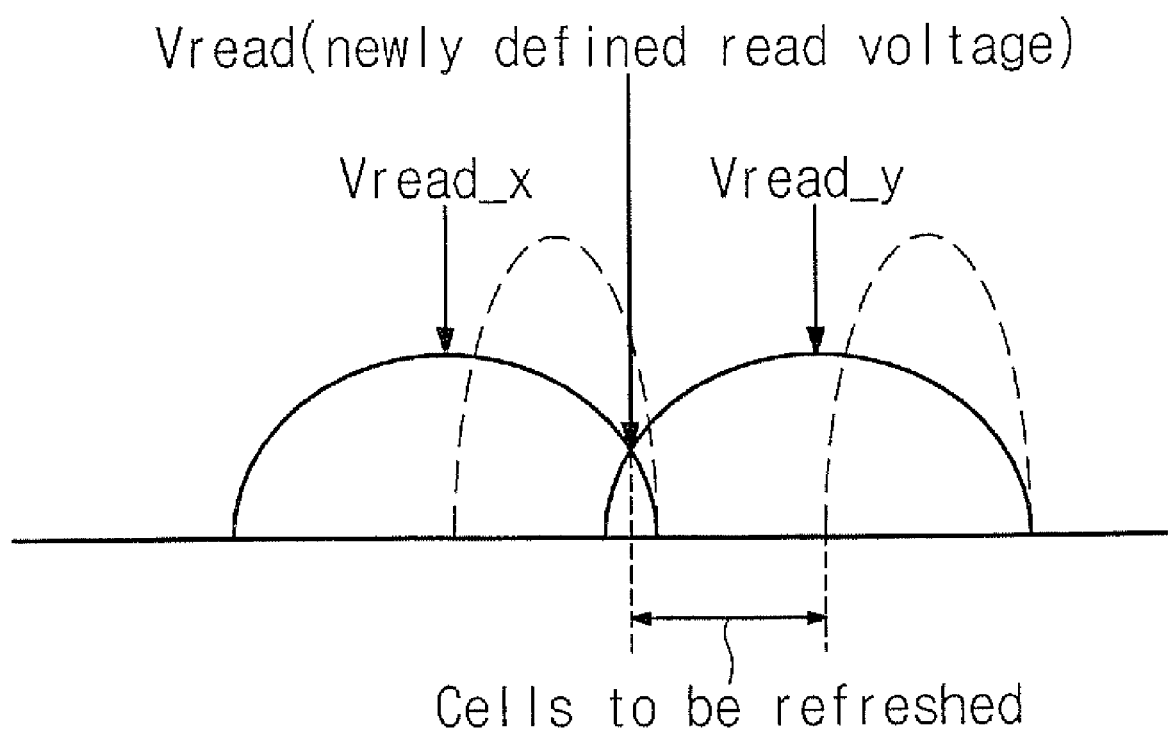
FIG. 17 is a diagram showing a new read voltage that may be set according to the data restore operations illustrated in FIG. 15.

For each distribution read voltage, the memory controller 2000 counts the number of data bits having an erase state (i.e., the number of memory cells having an erase state) in the received page data and configures a distribution table using these counted values (S420). That is, the memory controller 2000 may count the number of data '1' among read page data bits each time the distribution read voltage is increased by the increment. The memory controller 2000 configures a distribution table using these counted values and their corresponding read voltages as illustrated in FIG. 16. As shown in FIG. 16, for each state, the counted value gradually increases to a maximum value and thereafter decreases, consistent with the shapes of the threshold voltage distribution patterns. In step S430, the memory controller 2000 may determine the read voltages that correspond to the maximum point of each respective state using the counted values (the numbers of memory cells having an erase state). The memory controller 2000 may then define new read voltages based on the determined read voltages (S440). For example, referring to FIG. 17, the memory controller 2000 may define as a new read voltage an intermediate voltage that is between the read voltages corresponding to maximum points of adjacent states.

Afterwards, the memory controller 2000 may provide the flash memory device 1000 with a restore/refresh command together with the newly defined read voltages (S450). The flash memory device 1000 may perform a restore/refresh operation with respect to memory cells using the newly defined read voltages. The memory controller 2000 may determine when these restore operations have been completed 1000 is ended (S460). When a restore operation of the flash memory device 1000 is complete, the procedure ends.

The distribution read operation is performed on selected memory cells of the memory cell array 1100. In some embodiments, the distribution read operation may be performed on memory cells from all pages of the memory cell array 1100 In other embodiments, the distribution read operation is performed on memory cells of only selected of the memory blocks.

According to further embodiments of the present invention, the initial distribution read voltage may be set as a voltage that is sufficient to read a memory cell having the highest state. In this case, the read voltage may be decreased stepwise by a decrement. Except for this difference, a read operation according to a read voltage decrease manner may be carried out the same as the above-described read voltage increase manner.

Figure 18:
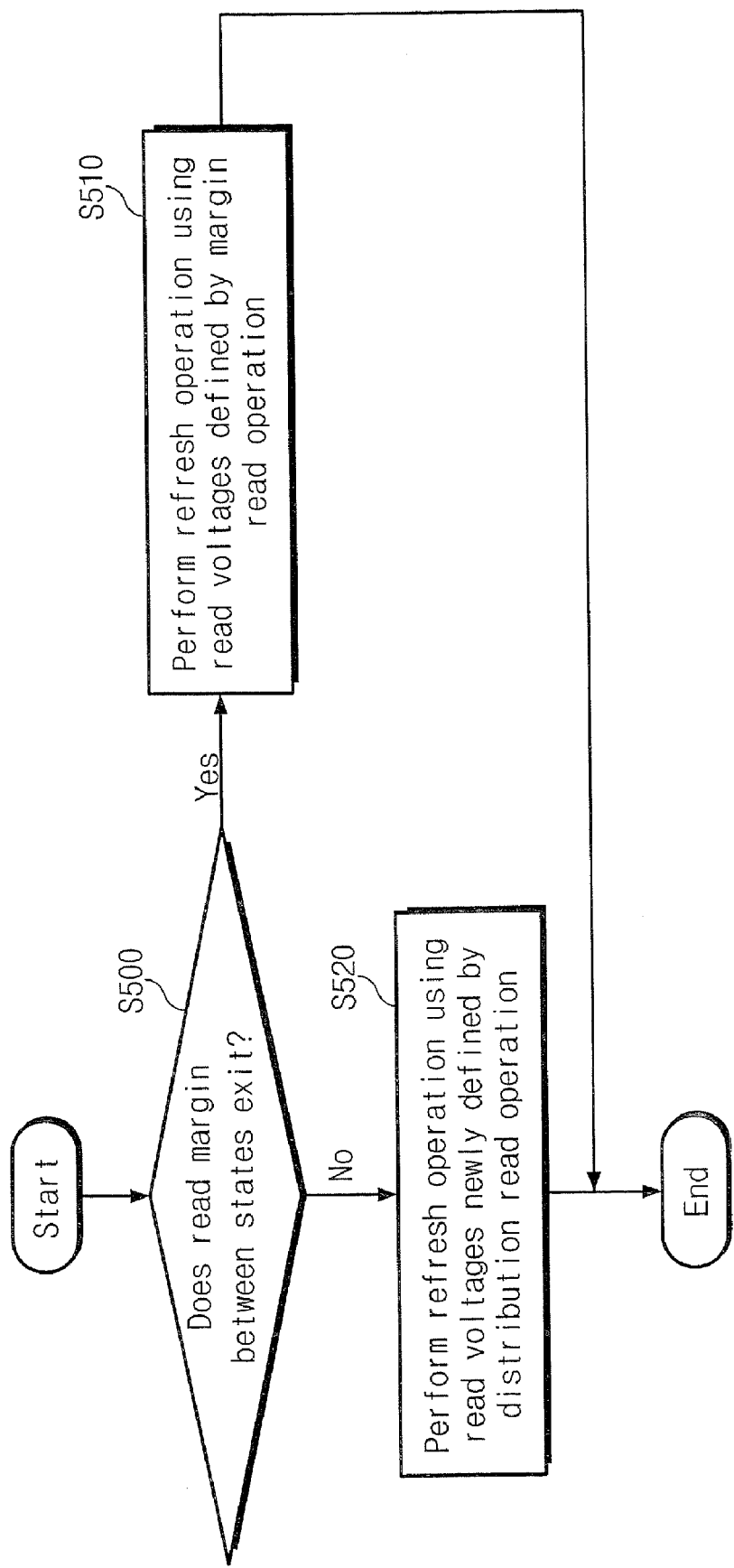
FIG. 18 is a flowchart for describing data restore operations according to further embodiments of the present invention.

FIG. 18 is a flowchart illustrating a data restore operation according to still further embodiments of the present invention. As shown in FIG. 18, a memory controller 2000 determines whether a read margin exists between adjacent states (S500). As described above, whether a read margin exists between adjacent states may be determined, for example, using minimum and maximum threshold voltages of each state that are obtained according to the state checking operation described in FIG. 8.

If a read margin exists between adjacent states, the memory controller 2000 may perform a refresh operation using new read voltages that are defined, for example, using a margin read operation (S510). This is substantially the same as described in FIG. 12, and description thereof is thus omitted. If no read margin exists between adjacent states, a refresh operation may be performed using read voltages that are newly defined by the distribution read operation described in FIG. 15 (S520).

Although not illustrated in figures, it is possible to determine minimum and maximum threshold voltage values of each state through a distribution read operation that is described in FIG. 15.

Figure 19:
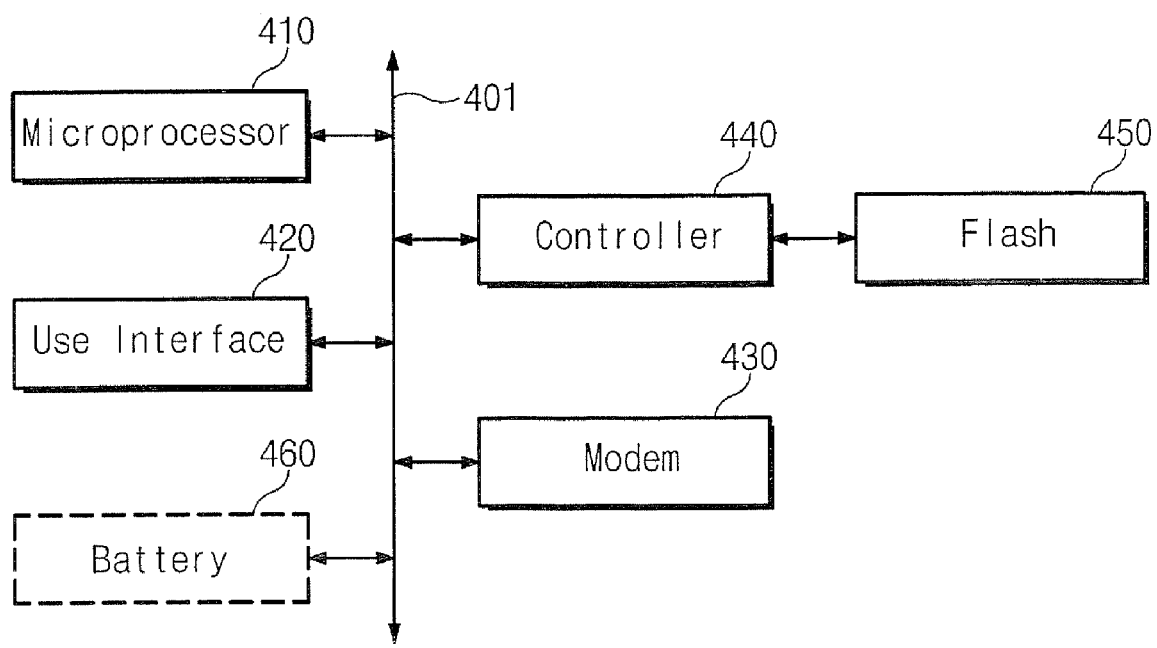
FIG. 19 is a block diagram showing a computing system including a flash memory device and a memory controller according to embodiments of the present invention.

FIG. 19 is a block diagram showing a schematic computing system that includes a flash memory device according to embodiments of the present invention. The computing system according to the present invention includes a microprocessor 410, a use interface 420, a modem 430 such as a baseband chipset, a memory controller 440, and the flash memory device 450. The memory controller 440 and the flash memory device 450 may be configured substantially the same as shown FIG. 3. In the flash memory device 450, N-bit data (N is a positive integer) to be processed by the microprocessor 410 are stored through the memory controller 440. The computing system may further include a battery 460 for supplying power thereto. Although not shown in FIG. 19, the computing system may be further equipped with an application chipset, a camera image processor (e.g., CMOS image sensor; CIS), a mobile DRAM, etc.

Although the present invention has been described in connection with the embodiment of the present invention illustrated in the accompanying drawings, it is not limited thereto. It will be apparent to those skilled in the art that various substitution, modifications and changes may be thereto without departing from the scope and spirit of the invention.

What is claimed is:

1. A method of setting a read voltage of a flash memory device that includes memory cells that store data by being set to one of a plurality of states, the method comprising:
    reading data from a plurality of memory cells of the flash memory device at a plurality of different voltages in order to obtain data regarding a first threshold voltage distribution for ones of the memory cells that are set to a first of the plurality of states and a second threshold voltage distribution for ones of the memory cells that are set to a second of the plurality of states; and
    setting a read voltage newly defined according to the obtained data to the flash memory device to restore charge-lost memory cells.

2. The method of claim 1, wherein the obtained data comprises a maximum threshold voltage for the first of the plurality of states and a minimum threshold voltage for the second of the plurality of states.

3. The method of claim 2, wherein the plurality of memory cells comprise memory cells of a representative region of a memory cell array of the flash memory device that is representative of the memory cells in a data region of the memory cell array.

4. The method of claim 2, wherein the read voltage is set about halfway between the maximum threshold voltage for the first of the plurality of states and the minimum threshold voltage for the second of the plurality of states.

5. The method of claim 1, wherein the obtained data comprises a distribution table that identifies, for each of the plurality of different voltages, the number of the plurality of memory cells that are in a first of the plurality of states when read at the respective one of the plurality of different voltages.

6. The method of claim 5, further comprising identifying the ones of the plurality of different voltages for which a maximum number of the plurality of memory cells are in the first of the plurality of states based on the obtained data in the distribution table.

7. The method of claim 1, wherein the plurality of different voltages are generated by incrementing or decrementing a starting voltage by a predetermined increment.

8. A method of setting a read voltage in a memory system which comprises a flash memory device that includes memory cells that store data by being set to one of a plurality of states, the method comprising:
    reading data from a plurality of memory cells of the flash memory device at each of a plurality of different distribution read voltages;
    identifying, for each of the plurality of states, the one of the plurality of distribution read voltages for which a maximum number of the plurality of memory cells are in the one of the plurality of states; and
    defining new read voltages based on the identifications as to the ones of the plurality of distribution read voltages for which a maximum number of the plurality of memory cells are in the one of the plurality of states;
    providing a distribution read command to the flash memory device, wherein the read data is output to a memory controller associated with the flash memory device in response to the distribution read command, and wherein the new read voltages are provided to the flash memory device; and
    performing a refresh operation using the new read voltages and verify read voltages of each of the plurality of states.

9. The method of claim 8, wherein the plurality of different distribution read voltages are generated by incrementing or decrementing a starting voltage by a predetermined increment.

10. The method of claim 8, wherein the new read voltages are defined so as to have an intermediate value between adjacent ones of the identified distribution read voltage.

11. The method of claim 10, further comprising carrying out a refresh operation on the flash memory device using the newly defined read voltages and verify read voltages of each of the plurality of states.

12. The method of claim 8, further comprising providing a distribution read command to the flash memory device, wherein the read data is output to a memory controller associated with the flash memory device in response to the distribution read command, and wherein the new read voltages are provided to the flash memory device.

13. The method of claim 12, further comprising performing a refresh operation using the new read voltages and verify read voltages of each of the plurality of states.

14. The method of claim 8, wherein reading data from a plurality of memory cells of the flash memory device at each of a plurality of different distribution read voltages comprises reading data from all of the pages of the flash memory device at each of a plurality of different distribution read voltages.

15. The method of claim 8, wherein reading data from a plurality of memory cells of the flash memory device at each of a plurality of different distribution read voltages comprises reading data from part of the pages of the flash memory device at each of a plurality of different distribution read voltages.

16. A method of setting a read voltage in a memory system which comprises a flash memory device that includes memory cells that store data by being set to one of a plurality of states, the method comprising:
    reading data from a plurality of memory cells of a representative region of the flash memory device at each of a plurality of different margin read voltages;
    determining, for each of the plurality of states, the minimum and maximum threshold voltages for each of the plurality of states based on the read data from the representative region; and
    defining new read voltages for each of the plurality of states based on the minimum and maximum threshold voltages for each of the plurality of states;
    wherein the minimum threshold voltage for each of the plurality of states corresponds to a margin read voltage for which at least one data bit among the read data indicates an erase state, and the maximum threshold voltage for each of the plurality of states corresponds to a margin read voltage for which all of the read data indicates a program state; and
    carrying out a refresh operation on the flash memory device using the newly defined read voltages and verify read voltages of each of the plurality of states.

17. The method of claim 16, wherein the minimum threshold voltage for each of the plurality of states corresponds to a margin read voltage for which at least one data bit among the read data indicates an erase state, and the maximum threshold voltage for each of the plurality of states corresponds to a margin read voltage for which all of the read data indicates a program state.

18. The method of claim 17, wherein the data is read from a representative region of the flash memory device.

19. The method of claim 17, wherein the plurality of margin read voltages are generated by incrementing or decrementing a starting voltage by a predetermined increment.

20. The method of claim 17, wherein each of the new read voltages is defined so as to have an intermediate value between the maximum threshold voltage for a respective one of the plurality of states and the minimum threshold voltage of the next higher state.

21. The method of claim 17, further comprising carrying out a refresh operation on the flash memory device using the newly defined read voltages and verify read voltages of each of the plurality of states.

22. The method of claim 18, wherein the flash memory device further comprises a data region, wherein a capacity of the representative region is determined to be sufficient for representing threshold voltage distributions of the data region.

23. The method of claim 22, wherein the data region of the flash memory device is managed by use of a wear-leveling process.

24. The method of claim 23, wherein the representative region is erased and programmed whenever a wear-leveling value with respect to the data region according to the wear-leveling process is reached.

25. The method of claim 16, wherein the minimum threshold voltage for each of the plurality of states corresponds to a margin read voltage for which at least one data bit among the read data indicates a program state, and the maximum threshold voltage for each of the plurality of states corresponds to a margin read voltage for which all of the read data indicates an erase state.

26. A data restore method of a memory system which comprises a flash memory device and a memory controller for controlling the flash memory device, the data restore method comprising:
    providing a wear-leveling read command to the flash memory device;
    judging whether a maximum wear-leveling value exceeds a wear-leveling reference value, based on a wear-leveling table from the flash memory device;
    if the maximum wear-leveling value exceeds the wear-leveling reference value, checking a charge-loss state with respect to a representative region of the flash memory device; and
    providing read voltages newly defined according to the checked charge-loss state to the flash memory device to restore charge-lost memory cells.

27. The data restore method of claim 26, wherein providing read voltages newly defined according to the checked charge-loss state to the flash memory device comprises:
    sequentially varying a margin read voltage to read respective page data from a representative region of the flash memory device, based on an input of the wear-leveling read command;
    determining minimum and maximum threshold voltages of each of possible cell states of a memory cell based on the page data from the representative region and the sequentially varied margin read voltages; and
    defining new read voltages of the cell states based on the minimum and maximum threshold voltages of the respective cell states,
    wherein the minimum threshold voltage of each cell state corresponds to a margin read voltage when at least one data bit among the page data respectively read from the flash memory device indicates an erase state, and the maximum threshold voltage of each cell state corresponds to a margin read voltage when the page data respectively read from the flash memory device all indicates a program state.

28. The data restore method of claim 27, wherein the margin read voltage is sequentially increased/decreased by an increment/decrement.

29. The data restore method of claim 27, wherein the new read voltages are defined so as to have an intermediate value between adjacent cell states.

30. The data restore method of claim 29, wherein the flash memory device further comprises a data region, a capacity of the representative region being determined to be sufficient for representing threshold voltage distributions of the data region.

31. The data restore method of claim 30, wherein the data region of the flash memory device is managed by use of a wear-leveling process.

32. The data restore method of claim 31, wherein the representative region is erased and programmed whenever a wear-leveling value with respect to the data region according to the wear-leveling process is counted up.

33. The data restore method of claim 26, wherein providing read voltages newly defined according to the checked charge-loss state to the flash memory device comprises:

sequentially varying a margin read voltage to read respective page data from a representative region of the flash memory device, based on an input of the wear-leveling read command;

determining minimum and maximum threshold voltages of each of possible cell states of a memory cell based on the page data from the representative region and the sequentially varied margin read voltages; and defining new read voltages of the cell states based on the minimum and maximum threshold voltages of the respective cell states, wherein the maximum threshold voltage of each cell state corresponds to a margin read voltage when at least one data bit among the page data respectively read from the flash memory device indicates a program state, and the minimum threshold voltage of each cell state corresponds to a margin read voltage when the page data respectively read from the flash memory device all indicates an erase state.

34. The data restore method of claim 26, wherein in a case where the maximum wear-leveling value exceeds the wear-leveling reference value, the checking and providing steps are selectively carried out based on whether a restore operation is selected by the outside.

35. The data restore method of claim 26, wherein checking a charge-loss state with respect to a representative region of the flash memory device comprises:

judging whether a read margin exists between cell states, based on the checked charge-loss state; and if the read margin exists between cell states, providing the newly defined read voltages to the flash memory device to restore charge-lost memory cells.

36. The data restore method of claim 26, wherein checking a charge-loss state with respect to a representative region of the flash memory device comprises:

judging whether a read margin exists between cell states, based on the checked charge-loss state;

if the read margin exists between cell states, providing the newly defined read voltages to the flash memory device to restore charge-lost memory cells; and if no read margin exists between cell states, providing a distribution read command to the flash memory device.

37. The data restore method of claim 36, wherein providing a distribution read command to the flash memory device comprises:

sequentially varying a distribution read voltage by an increment/decrement to read page data from the flash memory device, based on an input of the distribution read command;

generating a distribution table having a data bit number and a distribution read voltage, the data bit number indicating an erase state among the page data respectively read from the flash memory device and the distribution read voltage corresponding to the read page data;

detecting distribution read voltages corresponding to data bit numbers each indicating maximum points of possible cell states of a memory cell, based on the distribution table; and defining new read voltages based on the detected distribution read voltages.

38. A memory system comprising:

a flash memory device; and a memory controller for controlling the flash memory device, wherein the flash memory device includes memory cells that store data by being set to one of a plurality of states, and wherein the memory controller is configured to (a) read data from a plurality of memory cells of the flash memory device at a plurality of different voltages in order to obtain data regarding a first threshold voltage distribution for ones of the memory cells that are set to a first of the plurality of states and a second threshold voltage distribution for ones of the memory cells that are set to a second of the plurality of states and to (b) set a read voltage newly defined according to the obtained data to the flash memory device to restore charge-lost memory cells.

39. A memory system comprising:

a flash memory device; and a memory controller for controlling the flash memory device, wherein the flash memory device includes memory cells that store data by being set to one of a plurality of states, and wherein the memory controller is configured to (a) read data from a plurality of memory cells of the flash memory device at each of a plurality of different distribution read voltages, (b) identify, for each of the plurality of states, the one of the plurality of distribution read voltages for which a maximum number of the plurality of memory cells are in the one of the plurality of states, (c) define new read voltages based on the identifications as to the ones of the plurality of distribution read voltages for which a maximum number of the plurality of memory cells are in the one of the plurality of states, (d) provide a distribution read command to the flash memory device, wherein the read data is output to a memory controller associated with the flash memory device in response to the distribution read command, and wherein the new read voltages are provided to the flash memory device; and (e) perform a refresh operation using the new read voltages and verify read voltages of each of the plurality of states.

40. A memory system comprising:

a flash memory device; and a memory controller for controlling the flash memory device, wherein the flash memory device includes memory cells that store data by being set to one of a plurality of states, and wherein the memory controller is configured to (a) read data from a plurality of memory cells of a representative region of the flash memory device at each of a plurality of different margin read voltages, (b) determine, for each of the plurality of states, the minimum and maximum threshold voltages for each of the plurality of states based on the read data from the representative region, (c) define new read voltages for each of the plurality of states based on the minimum and maximum threshold voltages for each of the plurality of states, wherein the minimum threshold voltage for each of the plurality of states corresponds to a margin read voltage for which at least one data bit among the read data indicates an erase state, and the maximum threshold voltage for each of the plurality of states corresponds to a margin read voltage for which all of the read data indicates a program state; and (d) carry out a refresh operation on the flash memory device using the newly defined read voltages and verify read voltages of each of the plurality of states.

41. A memory system comprising:
a flash memory device; and
a memory controller for controlling the flash memory device, wherein the memory controller is configured to (a) provide a wear-leveling read command to the flash memory device, (b) judge whether a maximum wear-leveling value exceeds a wear-leveling reference value, based on a wear-leveling table from the flash memory device, (c) check a charge-loss state with respect to a representative region of the flash memory device if the maximum wear-leveling value exceeds the wear-leveling reference value and (d) provide read voltages newly defined according to the checked charge-loss state to the flash memory device to restore charge-lost memory cells.

* * * * *